(12) United States Patent
Fukuda

(10) Patent No.: US 10,797,268 B2
(45) Date of Patent: Oct. 6, 2020

(54) LIGHT-EMITTING DEVICE

(71) Applicant: JOLED INC., Tokyo (JP)

(72) Inventor: Toshihiro Fukuda, Tokyo (JP)

(73) Assignee: JOLED INC., Tokyo (JP)

( * ) Notice: Subject to any disclaimer, the term of this patent is extended or adjusted under 35 U.S.C. 154(b) by 7 days.

(21) Appl. No.: 16/154,727

(22) Filed: Oct. 9, 2018

(65) Prior Publication Data

US 2019/0123305 A1    Apr. 25, 2019

(30) Foreign Application Priority Data

Oct. 20, 2017    (JP) ................................. 2017-203784

(51) Int. Cl.
 *H01L 51/50*    (2006.01)
 *H01L 51/52*    (2006.01)
 *H01L 27/32*    (2006.01)

(52) U.S. Cl.
 CPC ...... *H01L 51/5271* (2013.01); *H01L 27/3206* (2013.01); *H01L 27/3244* (2013.01); *H01L 51/5036* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5265* (2013.01); *H01L 2251/5315* (2013.01)

(58) Field of Classification Search
 CPC ......... H01L 2251/5315; H01L 27/3206; H01L 27/3244; H01L 51/5036; H01L 51/5056; H01L 51/5072; H01L 51/5092; H01L 51/5206; H01L 51/5221; H01L 51/5265; H01L 51/5271
 See application file for complete search history.

(56) References Cited

U.S. PATENT DOCUMENTS

| | | | | |
|---|---|---|---|---|
| 7,102,282 B1* | 9/2006 | Yamada | ................. | H05B 33/22 313/506 |
| 8,373,342 B2* | 2/2013 | Fukuda | ................. | H05B 33/22 313/504 |
| 8,860,302 B2* | 10/2014 | Fukuda | ................. | H01K 1/26 313/504 |
| 8,946,684 B2* | 2/2015 | Fukuda | ................. | H01L 51/52 257/40 |
| 10,205,126 B2* | 2/2019 | Fukuda | ................. | H01L 27/322 |
| 2004/0105047 A1* | 6/2004 | Kato | ................. | H01L 51/5265 349/69 |
| 2008/0067926 A1 | 3/2008 | Mizuno et al. | | |

(Continued)

FOREIGN PATENT DOCUMENTS

JP    2008-91323 A    4/2008
JP    2011-159431 A    8/2011

(Continued)

*Primary Examiner* — Jaehwan Oh

(74) *Attorney, Agent, or Firm* — Hauptman Ham, LLP

(57) ABSTRACT

A light-emitting device includes a first reflective surface, a second reflective surface, a light-emitting layer, and a third reflective surface. The second reflective surface faces the first reflective surface. The light-emitting layer is provided between the first reflective surface and the second reflective surface, and outputs light of a wavelength $\lambda$. The third reflective surface faces the second reflective surface, and is located at a distance within $\lambda/4$ from the second reflective surface.

19 Claims, 15 Drawing Sheets

(56) References Cited

U.S. PATENT DOCUMENTS

| | | | |
|---|---|---|---|
| 2011/0187259 A1* | 8/2011 | Fukuda | H01L 51/5278 |
| | | | 313/114 |
| 2011/0187260 A1 | 8/2011 | Fukuda et al. | |
| 2011/0187261 A1 | 8/2011 | Fukuda et al. | |
| 2012/0206675 A1* | 8/2012 | Seo | H01L 51/5265 |
| | | | 349/96 |
| 2012/0235183 A1 | 9/2012 | Fukuda | |
| 2012/0256208 A1* | 10/2012 | Hatano | H01L 27/3211 |
| | | | 257/89 |
| 2014/0367660 A1* | 12/2014 | Fukuda | H01L 51/5265 |
| | | | 257/40 |
| 2015/0263076 A1* | 9/2015 | Seo | H01L 27/3213 |
| | | | 257/40 |

FOREIGN PATENT DOCUMENTS

| | | |
|---|---|---|
| JP | 2011-159433 A | 8/2011 |
| JP | 2012195226 A | 10/2012 |
| WO | 01/39554 A1 | 5/2001 |

* cited by examiner

LIGHT-EMITTING DEVICE

CROSS REFERENCE TO RELATED APPLICATIONS

This application claims the benefit of Japanese Priority Patent Application JP 2017-203784 filed on Oct. 20, 2017, the entire contents of which are incorporated herein by reference.

BACKGROUND

The disclosure relates to a light-emitting device that utilizes, for example, organic electroluminescence elements that emit light by an organic electroluminescence (EL) phenomenon.

In recent years, many proposals have been made regarding a structure of a light-emitting device that uses organic EL elements. For example, reference is made to International Publication No. WO01/039554, and Japanese Unexamined Patent Application Publications No. 2008-91323, No. 2011-159431, and No. 2011-159433. Optical resonance occurs by multiple reflection of light between two electrodes that face each other with a light-emitting layer being interposed therebetween. This type of resonator structure is utilized in the light-emitting device that uses organic EL elements.

SUMMARY

Such a light-emitting device having a resonator structure is requested to control a resonance state of light of a wide range of wavelengths.

It is desirable to provide a light-emitting device that makes it possible to control a resonance state of light of a wide range of wavelengths.

A light-emitting device according to an embodiment of the disclosure includes a first reflective surface, a second reflective surface, a light-emitting layer, and a third reflective surface. The second reflective surface faces the first reflective surface. The light-emitting layer is provided between the first reflective surface and the second reflective surface, and outputs light of a wavelength λ. The third reflective surface faces the second reflective surface, and is located at a distance within λ/4 from the second reflective surface.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Figure 1:
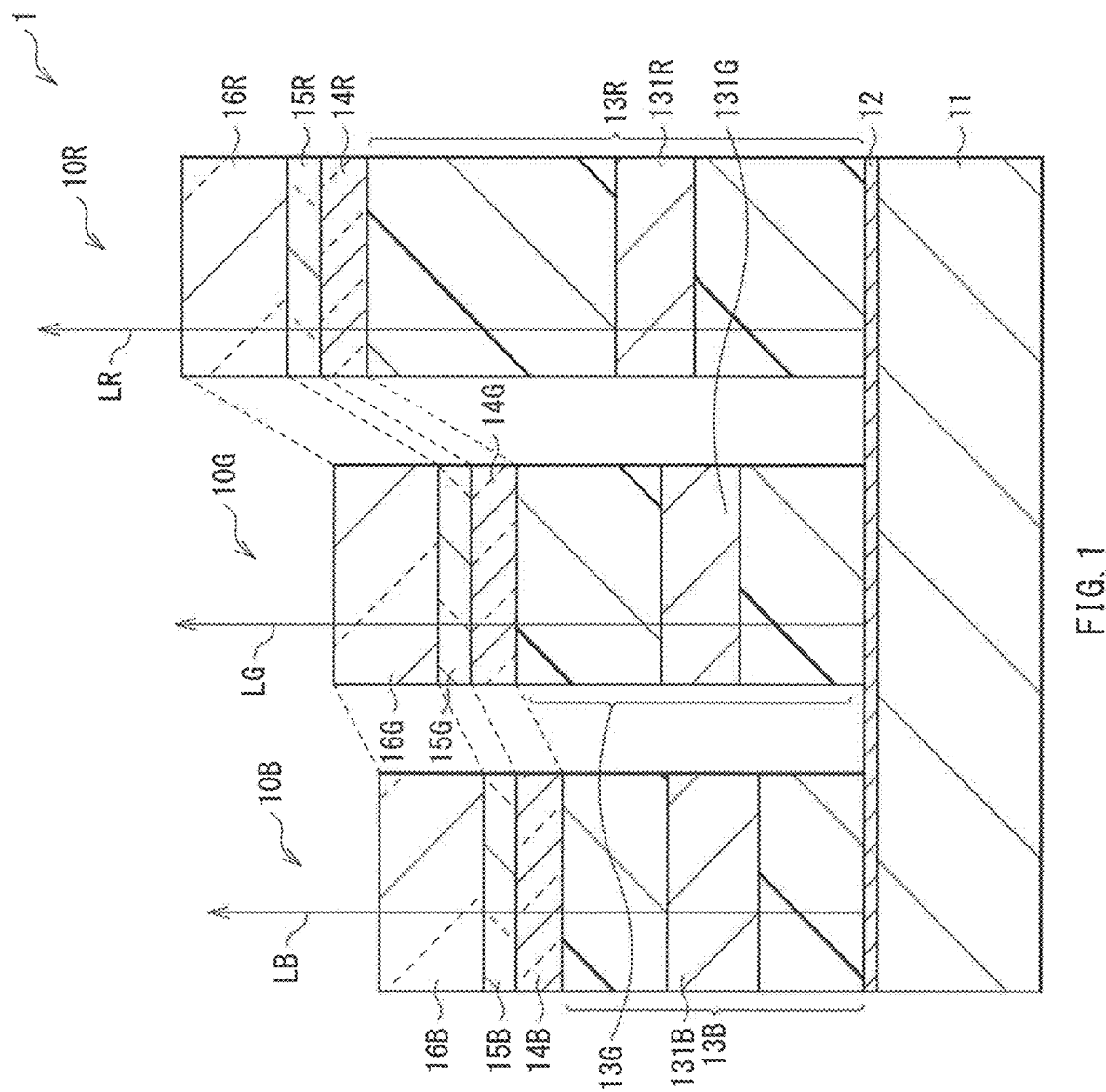
FIG. 1 is a schematic cross-sectional view of a general configuration of a light-emitting device according to one embodiment of the disclosure.

Some example embodiments of the disclosure are described in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (A light-emitting device having a third reflective surface near a second reflective surface)
2. Modification Example 1 (An example of reflection performed to strengthen light at a third reflective surface)
3. Modification Example 2 (An example of a light-emitting device of a bottom emission type)
4. Second Example Embodiment (A light-emitting device having a fourth reflective surface and a fifth reflective surface in addition to the third reflective surface)
5. Modification Example 3 (An example of a light-emitting device having a sixth reflective surface)
6. Application Example 1 (Examples of a display unit and an electronic apparatus)
7. Application Example 2 (An example of an illumination apparatus)

First Example Embodiment

[Configuration]

FIG. 1 illustrates a cross-sectional configuration of a main part of a light-emitting device, i.e., a light-emitting device 1 according to a first example embodiment of the disclosure. The light-emitting device 1 may include, on a substrate 11, a red organic EL element 10R, a green organic EL element 10G, and a blue organic EL element 10B. The red organic EL element 10R, the green organic EL element 10G, and the blue organic EL element 10B may be disposed in regions, on the substrate 11, that are different from one another, i.e., in non-overlapped regions in a plan view.

The red organic EL element 10R may include, on the substrate 11, a first electrode 12, a red organic layer 13R including a red light-emitting layer 131R, a first transparent layer 14R, a second electrode 15R, and a second transparent layer 16R in this order. The red light-emitting layer 131R corresponds to a specific but non-limiting example of a "first light-emitting layer" according to one embodiment of the disclosure. The green organic EL element 10G may include, on the substrate 11, the first electrode 12, a green organic layer 13G including a green light-emitting layer 131G, a first transparent layer 14G, a second electrode 15G, and a second transparent layer 16G in this order. The blue organic EL element 10B may include, on the substrate 11, the first electrode 12, a blue organic layer 13B including a blue light-emitting layer 131B, a first transparent layer 14B, a second electrode 15B, and a second transparent layer 16B in this order. The blue light-emitting layer 131B corresponds to a specific but non-limiting example of a "second light-emitting layer" according to one embodiment of the disclosure.

The red organic EL element 10R may output light of a red wavelength region, i.e., red light LR from side of the second transparent layer 16R. The red light LR is generated in the red light-emitting layer 131R. The green organic EL element 10G may output light of a green wavelength region, i.e., green light LG from side of the second transparent layer 16G. The green light LG is generated in the green light-emitting layer 131G. The blue organic EL element 10B may output light of a blue wavelength region, i.e., blue light LB from side of the second transparent layer 16B. The blue light LB is generated in the blue light-emitting layer 131B. The light-emitting device 1 may be configured to cause multiple reflection of the light outputted from the red light-emitting layer 131R, the light outputted from the green light-emitting layer 131G, and the light outputted from the blue light-emitting layer 131B, respectively, between the first electrode 12 and the second transparent layer 16R, between the first electrode 12 and the second transparent layer 16G, and between the first electrode 12 and the second transparent layer 16B, and to extract the resultant light. In other words, the light-emitting device 1 may be a light-emitting device of a top emission type having a resonator structure.

The substrate 11 may be a plate member that supports the red organic EL element 10R, the green organic EL element 10G, and the blue organic EL element 10B. The substrate 11 may be configured by, for example, a transparent glass substrate or a semiconductor substrate. The substrate 11 may be configured by a flexible substrate.

The first electrode 12 may serve as an anode electrode, and may also have a function as a reflective layer. The first electrode 12 may be provided, for example, in common for a red light-emitting element region 11R, a green light-emitting element region 11G, and a blue light-emitting element region 11B. For the first electrode 12, for example, a light reflective material such as aluminum (Al) and an alloy thereof, platinum (Pt), gold (Au), chromium (Cr), and tungsten (W) may be used. The first electrode 12 may be configured by a stack of a transparent electrically-conductive material and the light reflective material. In one embodiment, the first electrode 12 may have a thickness in a range from 100 nm to 300 nm.

The red organic layer 13R may include, for example, a hole injection layer, a hole transport layer, the red light-emitting layer 131R, an electron transport layer, and an electron injection layer in this order from the first electrode 12. The green organic layer 13G may include, for example, the hole injection layer, the hole transport layer, the green light-emitting layer 131G, the electron transport layer, and the electron injection layer in this order from the location closer to the first electrode 12. The blue organic layer 13B may include, for example, the hole injection layer, the hole transport layer, the blue light-emitting layer 131B, the electron transport layer, and the electron injection layer in this order from the location closer to the first electrode 12.

The hole injection layer may be a layer that prevents leakage, and may be made of, for example, hexaazatriphenylene (HAT). The hole injection layer may have a thickness of, for example, 1 nm to 20 nm. The hole transport layer may be made of, for example, α-NPD [N,N'-di(1-naphthyl)-N,N'-diphenyl-[1,1'-biphynyl]-4,4'-diamine]. The hole transport layer may have a thickness of, for example, 15 nm to 100 nm.

The red light-emitting layer 131R, the green light-emitting layer 131G, and the blue light-emitting layer 131B are each configured to output light of a predetermined color by recombination of holes and electrons, and may each have a thickness of, for example, 5 nm to 50 nm. The red light-emitting layer 131R may output light of the red wavelength region, and may be made of, for example, rubrene doped with a pyrromethene boron complex. At this occasion, the rubrene is used as a host material. The green light-emitting layer 131G may output light of the green wavelength region, and may be made of, for example, $Alq_3$ (a trisquinolinol aluminum complex). The blue light-emitting layer 131B may output light of the blue wavelength region, and may be made of, for example, ADN (9,10-di(2-naphtyl) anthracene) doped with a diaminochrysene derivative. At this occasion, the ADN, as a host material, may be vapor-deposited with a thickness of, for example, 20 nm on the hole transport layer, and may be doped with the diaminochrysene derivative as a dopant material at a relative film thickness ratio of 5%.

The electron transport layer may be made of BCP (2,9-dimethyl-4,7-diphenyl-1,10-phenanthroline). The electron transport layer may have a thickness of, for example, 15 nm to 200 nm. The electron injection layer may be made of, for example, lithium fluoride (LiF). The electron injection layer may have a thickness of, for example, 15 nm to 270 nm.

For example, the first transparent layers 14R, 14G, and 14B may be provided, respectively, between the red organic layer 13R and the second electrode 15R, between the green organic layer 13G and the second electrode 15G, and between the blue organic layer 13B and the second electrode 15B. The first transparent layers 14R, 14G, and 14B may be each made of, for example, a light-transmissive electrically-conductive material such as indium-tin oxide (ITO) and indium-zinc oxide (IZO). The first transparent layers 14R, 14G, and 14B may each serve as an electrode, together with the second electrodes 15R, 15G, and 15B, respectively.

The first transparent layers 14R, 14G, and 14B may be each made of, for example, a metal oxide such as zinc oxide (ZnO) and titanium oxide (TiO). Providing the first transparent layers 14R, 14G, and 14B made of a high resistance material such as zinc oxide (ZnO) and titanium oxide (TiO) suppresses, for example, occurrence of short circuit, caused by foreign matters, between the first electrode 12 and the second electrode 15R, between the first electrode 12 and the second electrode 15G, and between the first electrode 12 and the second electrode 15B, respectively. The first transparent layers 14R, 14G, and 14B each correspond to a specific but non-limiting example of a "high resistance layer" according to one embodiment of the disclosure. In other words, occurrence of a dark dot is suppressed. The first transparent layers 14R, 14G, and 14B may each have a stacked structure, as in first transparent layers 14RA and 14RB, for example, of FIG. 3 described later. The first transparent layers 14R, 14G, 14B may each have an optical film thickness of 30 nm to 450 nm, for example.

The second electrodes 15R, 15G, and 15B may face the first electrode 12, with the red organic layer 13R, the green organic layer 13G, and the blue organic layer 13B, respectively, being interposed therebetween. The second electrodes 15R, 15G, and 15B may be made of a light-transmissive electrically-conductive material. In one embodiment, the second electrodes 15R, 15G, and 15B may each have a thickness of 5 nm or more, and may be made of, for example, magnesium (Mg), silver (Ag), or an alloy thereof. Providing such second electrodes 15R, 15G, and 15B having high reflectance makes it possible to increase effects of the resonator structure, leading to enhancement in light extraction efficiency. This contributes to lower electric power consumption and also longer lives of the red organic EL element 10R, the green organic EL element 10G, and the blue organic EL element 10B. Moreover, providing the second electrodes 15R, 15G, and 15B each having sufficient thickness makes it possible to suppress occurrence of image quality failure caused by the second electrodes 15R, 15G, and 15B having reduced thickness, as described hereinafter.

The second transparent layers 16R, 16G, and 16B may be provided on side closer to light-extraction side than the second electrodes 15R, 15G, and 15B, respectively. The second transparent layers 16R, 16G, and 16B may face the red organic layer 13R, the green organic layer 13G, and the blue organic layer 13B, respectively, with the second electrodes 15R, 15G, and 15B being interposed therebetween. For the second transparent layers 16R, 16G, and 16B, for example, a light-transmissive electrically-conductive material or a light-transmissive dielectric material may be used. Non-limiting examples of the light-transmissive electrically-conductive material may include indium-tin oxide (ITO) and indium-zinc oxide (IZO). Non-limiting examples of the light-transmissive dielectric material may include silicon oxide ($SiO_2$), silicon oxynitride (SiON), and silicon nitride (SiN). The second transparent layers 16R, 16G, and 16B may each serve as an electrode, together with the second electrodes 15R, 15G, and 15B, respectively. In an alternative embodiment, the second transparent layers 16R, 16G, and 16B may each serve as a passivation film. For the second transparent layers 16R, 16G, and 16B, a low refractive index material such as MgF and NaF may be used.

In one embodiment, a layer of a thickness of 1 μm or more may be provided at an upper level of the second transparent layers 16R, 16G, and 16B. The layer of the thickness of 1 μm or more may be made of, for example, a transparent electrically-conductive material, a transparent insulating material, a resin material, or glass. The layer of the thickness of 1 μm or more may also be configured by an air gap. Providing such a layer makes it possible to prevent interference with respect to the resonator structure caused by its outside, with the resonator structure being formed between the first electrode 12 and each of the second transparent layers 16R, 16G, and 16B.

Figure 2A:
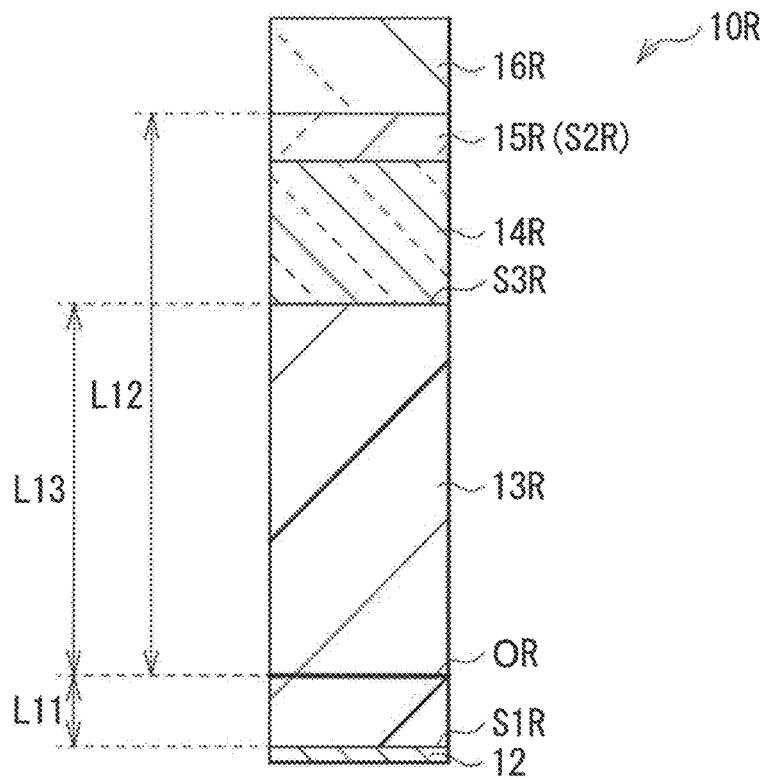
FIG. 2A is a schematic cross-sectional view of a resonance structure of a red organic EL element illustrated in FIG. 1.
Figure 2B:
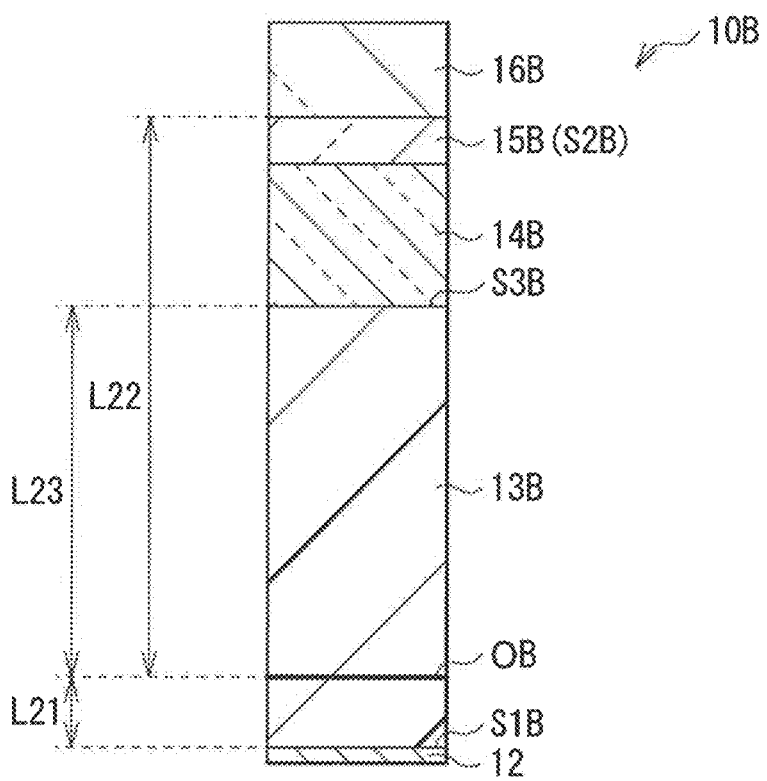
FIG. 2B is schematic cross-sectional view of a resonance structure of a blue organic EL element illustrated in FIG. 1.
Figure 2C:
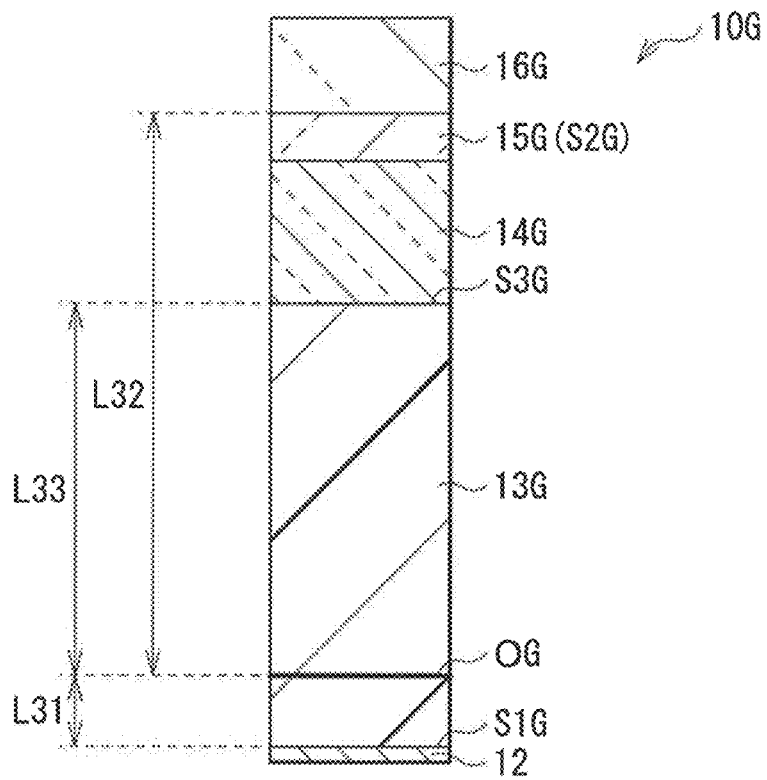
FIG. 2C is schematic cross-sectional view of a resonance structure of a green organic EL element illustrated in FIG. 1.

FIGS. 2A, 2B, and 2C illustrate respective resonator structures of the red organic EL element 10R, the blue organic EL element 10B, and the green organic EL element 10G.

The red organic EL element 10R includes a first reflective surface S1R, a third reflective surface S3R, and a second reflective surface S2R in this order from side of the substrate 11, as illustrated in FIG. 2A. In the red organic EL element 10R, light (the red light LR) may be extracted from side of the second reflective surface S2R. A light emission center OR of the red light-emitting layer 131R may be provided between the first reflective surface S1R and the third reflective surface S3R. For example, the first electrode 12 may face the red light-emitting layer 131R with the first reflective surface S1R being interposed therebetween. The first transparent layer 14R may be provided, for example, between the red light-emitting layer 131R (the light emission center OR) and the second reflective surface S2R.

The blue organic EL element 10B includes a first reflective surface S1B, a third reflective surface S3B, and a second reflective surface S2B in this order from the side of the substrate 11, as illustrated in FIG. 2B. In the blue organic EL element 10B, light (the blue light LB) may be extracted from side of the second reflective surface S2B. A light emission center OB may be provided between the first reflective surface S1B and the third reflective surface S3B. For example, the first electrode 12 may face the blue light-emitting layer 131B with the first reflective surface S1B being interposed therebetween. The first transparent layer 14B may be provided between the blue light-emitting layer 131B (the light emission center OB) and the second reflective surface S2B.

The green organic EL element 10G includes a first reflective surface S1G, a third reflective surface 53G, and a second reflective surface S2G in this order from the side of the substrate 11, as illustrated in FIG. 2C. In the green organic EL element 10G, light (the green light LG) may be extracted from side of the second reflective surface S2G. A light emission center OG may be provided between the first reflective surface S1G and the third reflective surface S3G. For example, the first electrode 12 may face the green light-emitting layer 131G with the first reflective surface S1G being interposed therebetween. The first transparent layer 14G may be provided between the green light-emitting layer 131G (the light emission center OG) and the second reflective surface S2G.

The first reflective surface S1R may be an interface, for example, between the first electrode 12 and the red organic layer 13R. The first reflective surface S1B may be an interface, for example, between the first electrode 12 and the blue organic layer 13B. The first reflective surface S1G may be an interface, for example, between the first electrode 12 and the green organic layer 13G. The first reflective surfaces S1R may be formed by an interface between a refractive index of a constituent material of the first electrode 12 and a refractive index of a constituent material of the red organic layer 13R. The first reflective surface S1B may be formed by an interface between a refractive index of the constituent material of the first electrode 12 and a refractive index of a constituent material of the blue organic layer 13B. The first reflective surfaces S1G may be formed by an interface between a refractive index of the constituent material of the first electrode 12 and a refractive index of a constituent material of the green organic layer 13G. For example, aluminum (Al) that constitutes the first electrode 12 may have a refractive index of 0.73 and an extinction coefficient of 5.91. The red organic layer 13R and the blue organic layer 13B may each have a refractive index of 1.75. The first reflective surface S1R may be located at an optical distance L11 from the light emission center OR. The first reflective surface S1B may be located at an optical distance L21 from the light emission center OB. The first reflective surface S1G may be located at an optical distance L31 from the light emission center OG.

The optical distance L11 may be so set as to strengthen light of a center wavelength λ1 of a light emission spectrum of the red light-emitting layer 131R, by interference between the first reflective surface S1R and the light emission center OR. The optical distance L21 may be so set as to strengthen light of a center wavelength λ2 of a light emission spectrum of the blue light-emitting layer 131B, by interference between the first reflective surface S1B and the light emission center OB. The optical distance L31 may be so set as to strengthen light of a center wavelength λ3 of a light emission spectrum of the green light-emitting layer 131G, by interference between the first reflective surface S1G and the light emission center OG.

In a specific but non-limiting example, the optical distances L11, L21, and L31 may be configured to satisfy the following expressions [1] to [4], [25], and [26]. The optical distance L11 may be, for example, 125 nm. The optical distance L21 may be, for example, 88 nm. The optical distance L31 may be, for example, 101 nm.

$$2L11/\lambda 11+a1/(2\pi)=m1 \text{(provided that } m1 \geq 0\text{)} \quad [1]$$

$$\lambda 1-150<\lambda 11<\lambda 1+80 \quad [2]$$

$$2L21/\lambda 21+c1/(2\pi)=n1 \text{(provided that } n1 \geq 0\text{)} \quad [3]$$

$$\lambda 2-150<\lambda 21<\lambda 2+80 \quad [4]$$

$$2L31/\lambda 31+b1/(2\eta)=p1 \text{(provided that } p1 \geq 0\text{)} \quad [25]$$

$$\lambda 3-150<\lambda 31<\lambda 3+80 \quad [26]$$

where m1, n1, and p1 each denote an integer,

λ1, λ2, λ3, λ11, λ21, and λ31 are each in unit of nm, a1 denotes a phase change generated upon reflection, at the first reflective surface S1R, of light of each wavelength outputted from the red light-emitting layer 131R, c1 denotes a phase change generated upon reflection, at the first reflective surface S1B, of light of each wavelength outputted from the blue light-emitting layer 131B, and b1 denotes a phase change generated upon reflection, at the first reflective surface S1G, of light of each wavelength outputted from the green light-emitting layer 131G.

The above-mentioned a1, c1, and b1 may be calculated using n0 and k in a complex refractive index N=n0−jk (where n0 denotes a refractive index and k denotes an extinction coefficient) of the constituent material of the first electrode 12, and the refractive indexes of the red organic layer 13R, the blue organic layer 13B, and the green organic layer 13G. Reference is made, for example, to "Principles of Optics", Max Born and Emil Wolf, 1974, PERGAMON PRESS. The refractive indexes of the constituent materials may be measured with use of a spectral ellipsometry measurement device.

In one embodiment, m1 may be equal to 0 (m1=0), n1 may be equal to 0 (n1=0), and p1 may be equal to 0 (p1=0), because so-called microcavity (microresonator) effects are not produced when values of m1, n1, and p1 are large. For example, the optical distance L11 may satisfy both of the following expressions [27] and [28].

$$2L11/\lambda 11+a1/(2\pi)=0 \quad [27]$$

$$\lambda 1-150=450<\lambda 11=600<\lambda 1+80=680 \quad [28]$$

The first reflective surface S1R that satisfies the expression [27] is provided at a position of zero-order interference, and thus exhibits high transmittance over a wide wavelength band. Accordingly, as given in the expression [28], λ11 may be largely shifted from the center wavelength λ1. The same holds true also for the optical distances L21 and L31.

The second reflective surface S2R faces the first reflective surface S1R with the light emission center OR, i.e., the red light-emitting layer 131R being interposed therebetween. The second reflective surface S2R may be configured by, for example, the second electrode 15R having reflectivity. The second reflective surface S2B faces the first reflective surface S1B with the light emission center OB, i.e., the blue light-emitting layer 131B being interposed therebetween. The second reflective surface S2B may be configured by, for example, the second electrode 15B having reflectivity. The second reflective surface S2G faces the first reflective surface S1G with the light emission center OG, i.e., the green light-emitting layer 131G being interposed therebetween. The second reflective surface S2G may be configured by, for example, the second electrode 15G having reflectivity. The second reflective surfaces S2R, S2B, and S2G may be configured by respective interfaces between the first transparent layers 14R, 14B, and 14G and the second electrodes 15R, 15B, and 15G. The second reflective surface S2R may be located at an optical distance L12 from the light emission center OR. The second reflective surface S2B may be located at an optical distance L22 from the light emission center OB. The second reflective surface S2G may be located at an optical distance L32 from the light emission center OG.

The optical distance L12 may be so set as to strengthen the light of the center wavelength λ1 of the light emission spectrum of the red light-emitting layer 131R, by interference between the second reflective surface S2R and the light emission center OR. The optical distance L22 may be so set as to strengthen the light of the center wavelength λ2 of the light emission spectrum of the blue light-emitting layer 131B, by interference between the second reflective surface S2B and the light emission center OB. The optical distance L32 may be so set as to strengthen the light of the center wavelength λ3 of the light emission spectrum of the green light-emitting layer 131G, by interference between the second reflective surface S2G and the light emission center OG.

In a specific but non-limiting example, the optical distances L12, L22, and L32 may be configured to satisfy the following expressions [5] to [8], [29], and [30]. The optical distance L12 may be, for example, 390 nm. The optical distance L22 may be, for example, 243 nm. The optical distance L32 may be, for example, 320 nm.

$$2L12/\lambda 12 + a2/(2\pi) = m2 \quad [5]$$

$$\lambda 1 - 80 < \lambda 12 < \lambda 1 + 80 \quad [6]$$

$$2L22/\lambda 22 + c2/(2\pi) = n2 \quad [7]$$

$$\lambda 2 - 80 < \lambda 22 < \lambda 2 + 80 \quad [8]$$

$$2L32/\lambda 32 + b2/(2\pi) = p2 \quad [29]$$

$$\lambda 3 - 80 < \lambda 32 < \lambda 3 + 80 \quad [30]$$

where m2, n2, and p2 each denote an integer,

λ1, λ2, λ3, λ12, λ22, and λ32 are each in unit of nm, a2 denotes a phase change generated upon reflection, at the second reflective surface S2R, of light of each wavelength outputted from the red light-emitting layer 131R, c2 denotes a phase change generated upon reflection, at the second reflective surface S2B, of light of each wavelength outputted from the blue light-emitting layer 131B, and b2 denotes a phase change generated upon reflection, at the second reflective surface S2G, of light of each wavelength outputted from the green light-emitting layer 131G.

The above-mentioned a2, c2, and b2 may be determined in methods similar to those for a1, c1, and b1.

In one embodiment, m2 may be equal to 1 (m2=1), n2 may be equal to 1 (n2=1), and p2 may be equal to 1 (p2=1), because the so-called microcavity (microresonator) effects are not produced when values of m2, n2, and p2 are large.

The third reflective surface S3R that faces the second reflective surface S2R may be provided, for example, between the red organic layer 13R and the second reflective surface S2R, i.e., at a location closer to the light emission center OR than the second reflective surface S2R. The third reflective surface S3B that faces the second reflective surface S2B may be provided, for example, between the blue organic layer 13B and the second reflective surface S2B, i.e., at a location closer to the light emission center OB than the second reflective surface S2B. The third reflective surface S3G that faces the second reflective surface S2G may be provided, for example, between the green organic layer 13G and the second reflective surface S2G, i.e., at a location closer to the light emission center OG than the second reflective surface S2G.

Such third reflective surfaces S3R, S3B, and S3G may be each an interface between a high refractive index layer and a low refractive index layer that have different refractive indexes. The third reflective surfaces S3R, S3B, and S3G may be, for example, respective interfaces between the red organic layer 13R, the blue organic layer 13B, and the green organic layer 13G, and the first transparent layers 14R, 14B, and 14G. The red organic layer 13R, the blue organic layer 13B, and the green organic layer 13G each correspond to a specific but non-limiting example of a "low refractive index layer" according to one embodiment of the disclosure. The first transparent layers 14R, 14B, and 14G each correspond to a specific but non-limiting example of a "high refractive index layer" according to one embodiment of the disclosure. For example, the red organic layer 13R, the blue organic layer 13B, and the green organic layer 13G may each have a refractive index of 1.8. The first transparent layers 14R, 14B, and 14G made of a transparent electrically-conductive material may each have a refractive index of 2.0. The third reflective surface S3R may be located at an optical distance L13 from the light emission center OR. The third reflective surface S3B may be located at an optical distance L23 from the light emission center OB. The third reflective surface S3G may be located at an optical distance L33 from the light emission center OG.

In the present example embodiment, such third reflective surfaces S3R, S3B, and S3G may be located at distances within (λ1)/4, (λ2)/4, and (λ3)/4, respectively, from the second reflective surfaces S2R, S2B, and S2G. In other words, the third reflective surfaces S3R, S3B, and S3G may satisfy the following expressions [31] to [33]. In the expressions [31] to [33], (λ1)/4, (λ2)/4, and (λ3)/4 may be each, for example, 50 nm to 60 nm. In one embodiment, (λ1)/4, (λ2)/4, and (λ3)/4 may be each smaller than 90 nm.

$$|L12 - L13| \leq (\lambda 1)/4 \quad [31]$$

$$|L22 - L23| \leq (\lambda 2)/4 \quad [32]$$

$$|L32 - L33| \leq (\lambda 3)/4 \quad [33]$$

where λ1, λ2, and λ3 are each in unit of nm.

Accordingly, reflections, of the light outputted from the red light-emitting layer 131R, the light outputted from the blue light-emitting layer 131B, and the light outputted from the green light-emitting layer 131G, respectively, at the third reflective surfaces S3R, S3B, and S3G exhibit similar tendency. The light outputted from the red light-emitting layer 131R may be the light of the center wavelength λ1 of the light emission spectrum. The light outputted from the blue light-emitting layer 131B may be the light of the center wavelength λ2 of the light emission spectrum. The light outputted from the green light-emitting layer 131G may be the light of the center wavelength λ3 of the light emission spectrum. One reason for the exhibition of the similar tendency is that disposing the third reflective surfaces S3R, S3B, and S3G, respectively, near the second reflective surfaces S2R, S2B, and S2G makes influence of the distance on a phase shift smaller. In one embodiment, the third reflective surfaces S3R, S3B, and S3G may be located at distances within (λ1)/8, (λ2)/8, and (λ3)/8, respectively, from the second reflective surfaces S2R, S2B, and S2G.

The optical distance L13 may be so set as to weaken the light of the center wavelength λ1 of the light emission spectrum of the red light-emitting layer 131R, by interference between the third reflective surface S3R and the light emission center OR. The optical distance L23 may be so set as to weaken the light of the center wavelength λ2 of the light emission spectrum of the blue light-emitting layer 131B, by interference between the third reflective surface S3B and the light emission center OB. The optical distance L33 may be so set as to weaken the light of the center wavelength λ3 of the light emission spectrum of the green light-emitting layer 131G, by interference between the third reflective surface S3G and the light emission center OG.

In a specific but non-limiting example, the optical distances L13, L23, and L33 may be configured to satisfy the following expressions [9] to [12], [34], and [35]. The optical distance L13 may be, for example, 343 nm. The optical distance L23 may be, for example, 196 nm. The optical distance L33 may be, for example, 273 nm.

$$2L13/\lambda13 + a3/(2\pi) = m3 + \tfrac{1}{2} \qquad [9]$$

$$\lambda1 - 150 < \lambda13 < \lambda1 + 150 \qquad [10]$$

$$2L23/\lambda23 + c3/(2\pi) = n3 + \tfrac{1}{2} \qquad [11]$$

$$\lambda2 - 150 < \lambda23 < \lambda2 + 150 \qquad [12]$$

$$2L33/\lambda33 + b3/(2\pi) = p3 + \tfrac{1}{2} \qquad [34]$$

$$\lambda3 - 150 < \lambda33 < \lambda3 + 150 \qquad [35]$$

where m3, n3, and p3 each denote an integer,

λ1, λ2, λ3, λ13, λ23, and λ33 are each in unit of nm, a3 denotes a phase change generated upon reflection, at the third reflective surface S3R, of light of each wavelength outputted from the red light-emitting layer 131R, c3 denotes a phase change generated upon reflection, at the third reflective surface S3B, of light of each wavelength outputted from the blue light-emitting layer 131B, and b3 denotes a phase change generated upon reflection, at the third reflective surface S3G, of light of each wavelength outputted from the green light-emitting layer 131G.

The above-mentioned a3, c3, and b3 may be determined in methods similar to those for a1, c1, and b1.

As described above, in the light-emitting device 1, the third reflective surfaces S3R, S3B, and S3G uniformly weaken respective resonances of the light outputted from the red light-emitting layer 131R, the light outputted from the green light-emitting layer 131G, and the light outputted from the blue light-emitting layer 131B, thus making it possible to enhance viewing angle characteristics, as described later in greater detail.

Figure 3:
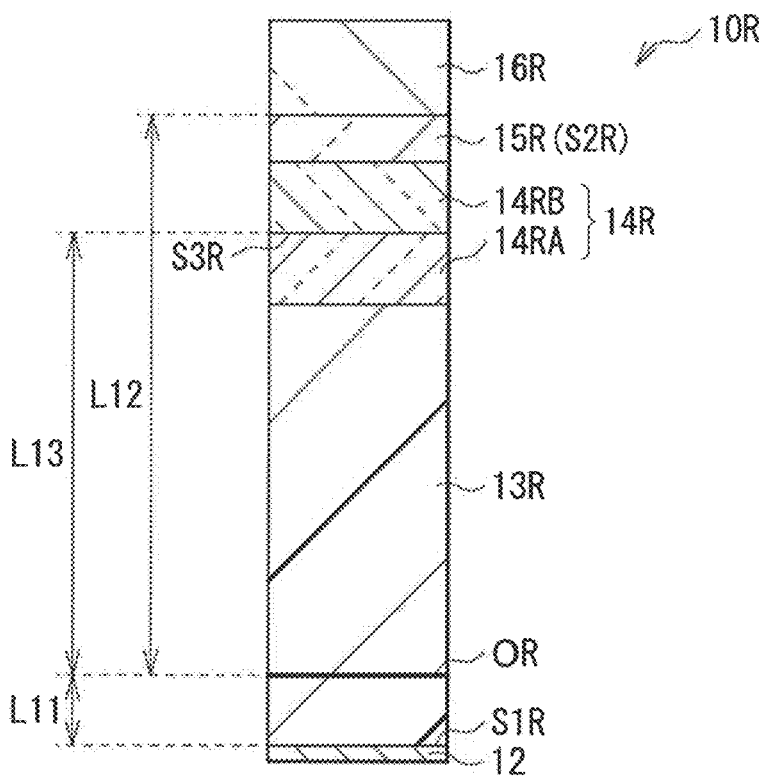
FIG. 3 is a schematic cross-sectional view of another example (1) of a third reflective surface illustrated in FIG. 2A.

FIG. 3 illustrates a configuration of the red organic EL element 10R including the first transparent layer 14R having a stacked structure (i.e., the first transparent layers 14RA and 14RB). For example, the first transparent layer 14RA and the first transparent layer 14RB may be disposed in this order from side of the red organic layer 13R. The first transparent layer 14RA and the first transparent layer 14RB may have different refractive indexes. In such a red organic EL element 10R, the third reflective surface S3R may be an interface between the first transparent layer 14RA and the first transparent layer 14RB. Likewise, the third reflective surface S3B of the blue organic EL element 10B and the third reflective surface S3G of the green organic EL element 10G may be respective interfaces in the first transparent layers 14B and 14G each having a stacked structure, although illustration is omitted.

Figure 4:
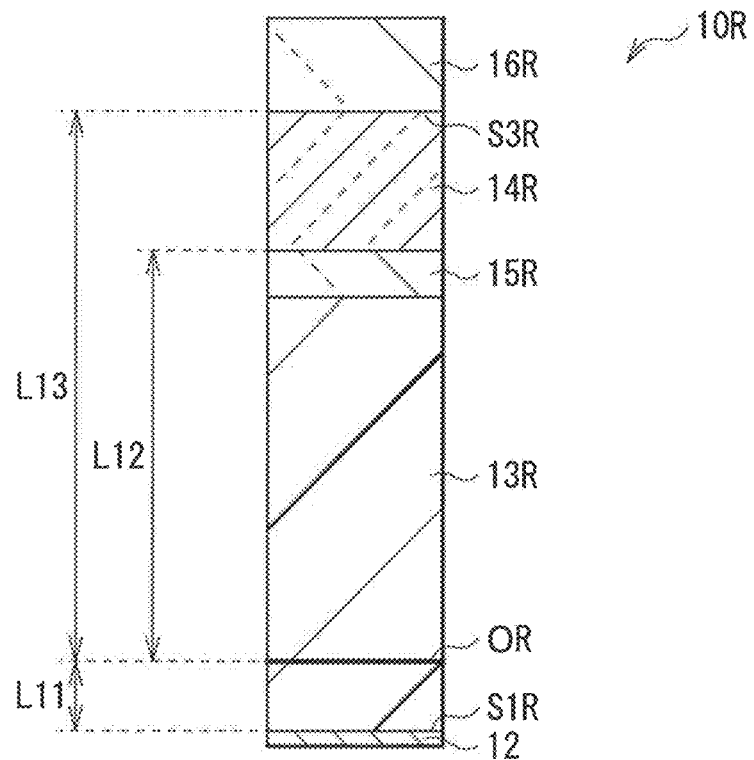
FIG. 4 is a schematic cross-sectional view of another example (2) of the third reflective surface illustrated in FIG. 2A.

FIG. 4 illustrates a configuration of the red organic EL element 10R including the first transparent layer 14R between the second electrode 15R and the second transparent layer 16R. For example, the third reflective surface S3R may be an interface between the first transparent layer 14R and the second transparent layer 16R. As described above, the third reflective surface S3R may be disposed at a location that faces the red organic layer 13R with the second reflective surface S2R being interposed therebetween, i.e., at a location more distant from the light emission center OR than the second reflective surface S2R. Likewise, the third reflective surface S3B of the blue organic EL element 10B may be disposed at a location that faces the blue organic layer 13B with the second reflective surface S2B being interposed therebetween, i.e., at a location more distant from the light emission center OB than the second reflective surface S2B, although illustration is omitted. The third reflective surface S3G of the green organic EL element 10G may be disposed at a location that faces the green organic layer 13G with the second reflective surface S2G being interposed therebetween, i.e., at a location more distant from the light emission center OG than the second reflective surface S2G, although illustration is omitted.

Such a light-emitting device 1 may be manufactured by forming, on the substrate 11, the first electrode 12, the organic layers, i.e., the red organic layer 13R, the green organic layer 13G, and the blue organic layer 13B, the first transparent layers 14R, 14G, and 14B, the second electrodes 15R, 15G, and 15B, and the second transparent layers 16R, 16G, and 16B in this order. The red organic layer 13R, the green organic layer 13G, and the blue organic layer 13B may be each formed by a vapor deposition method. In an alternative embodiment, the red organic layer 13R, the green organic layer 13G, and the blue organic layer 13B may be formed by printing. In other words, the red organic layer 13R, the green organic layer 13G, and the blue organic layer 13B may be each a printed layer. The first transparent layers 14R, 14G, and 14B and the second transparent layers 16R, 16G, and 16B may constitute a common layer, and may be made of the same constituent material, with the same thickness, in the red organic EL element 10R, the green organic EL element 10G, and the blue organic EL element 10B. The second electrodes 15R, 15G, and 15B may be provided in common to the red organic EL element 10R, the green organic EL element 10G, and the blue organic EL element 10B.

[Workings and Effects]

In the light-emitting device 1 as described above, a drive current is injected into each of the light-emitting layers, i.e., the red light-emitting layer 131R of the red organic EL element 10R, the green light-emitting layer 131G of the green organic EL element 10G, and the blue light-emitting layer 131B of the blue organic EL element 10B through the first electrode 12 and the second electrodes 15R, 15G, and 15B, holes and electrons recombine in each of the light-emitting layers to generate excitons, causing the light emission.

Figure 5:
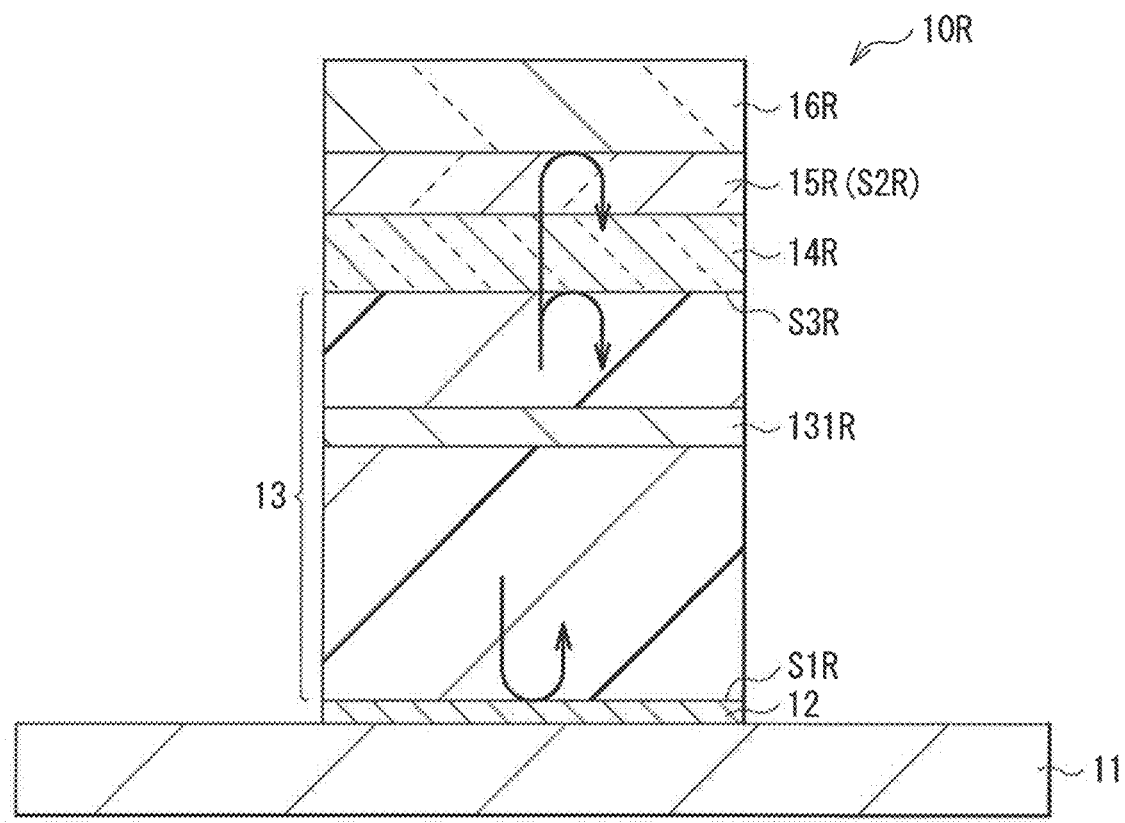
FIG. 5 is a schematic cross-sectional view that describes an operation of the light-emitting device illustrated in FIG. 1.

As illustrated in FIG. 5, in the red organic EL element 10R, the light outputted from the red light-emitting layer 131R is subjected to the multiple reflection between the first reflective surfaces S1R and the second reflective surface S2R, and the light having been subjected to the multiple reflection is extracted from the side of the second transparent layer 16R. In the red organic EL element 10R, the red light LR is extracted. Likewise, in the green organic EL element 10G, the green light LG is extracted, and, in the blue organic EL element 10B, the blue light LB is extracted. Additive color mixture of the red light LR, the green light LG, and the blue light LB provides expression of various colors.

In the light-emitting device 1 of the present example embodiment, providing the third reflective surfaces S3R, S3B, and S3G, respectively, near the second reflective surfaces S2R, S2B, and S2G makes it possible to uniformly control respective reflections, at the third reflective surfaces S3R, S3B, and S3G, of the light outputted from the red light-emitting layer 131R, the light outputted from the blue light-emitting layer 131B, and the light outputted from the green light-emitting layer 131G. This is described below by referring to a comparative example.

Figure 6:
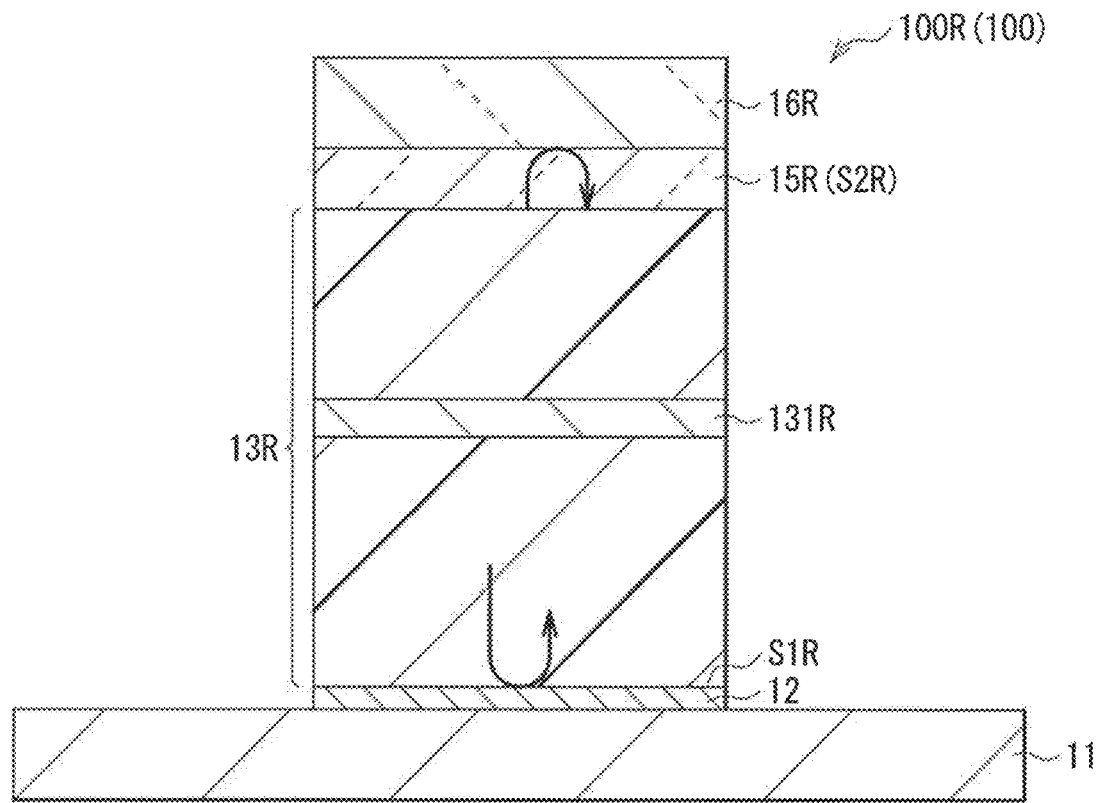
FIG. 6 is a schematic cross-sectional view illustrating a configuration of a light-emitting device according to Comparative Example 1.

FIG. 6 illustrates a configuration of a red organic EL element, i.e., a red organic EL element 100R provided in a light-emitting device, i.e., a light-emitting device 100 according to Comparative Example 1. The red organic EL element 100R includes the first reflective surface S1R and the second reflective surface S2R. The red organic EL element 100R includes no third reflective surface, i.e., no third reflective surface S3R in FIG. 2A. Similarly to the red organic EL element 100R, a green organic EL element and a blue green organic EL element of the light-emitting device 100 include no third reflective surface.

In such a light-emitting device including the red organic EL element 100R or other elements, it is conceivable, for example, to so set a film thickness between the first reflective surface S1R and the second reflective surface S2R as to cause resonance of light of a desired wavelength, thus enhancing light emission efficiency. For example, reference is made to International Publication No. WO01/039554. It is also conceivable to control film thicknesses of organic layers such as the red organic layer 13R to thereby control balance of attenuation of three primary colors, i.e., red, green and blue, thus enhancing viewing angle characteristics of a white chromaticity point. For example, reference is made to Japanese Unexamined Patent Application Publication No. 2008-91323.

However, such a resonance structure of the red organic EL element 100R serves as an interference filter having a small half value width, with respect to a spectrum of light to be extracted. Accordingly, in a case where a light extraction plane is viewed obliquely, light wavelength may be largely shifted. This causes lowered intensity of light emission and chromaticity shift, for example, depending on viewing angle, thus resulting in high viewing angle dependency.

In particular, raising reflectance of the second reflective surface S2R causes the viewing angle dependency to be higher, thus significantly lowering image quality. For example, increasing thickness of the second electrode 15R raises the reflectance of the second reflective surface S2R. Meanwhile, the second electrode 15R has an electric function as a cathode in addition to an optical function as the second reflective surface S2R. Accordingly, decreasing the thickness of the second electrode 15R leads to a possibility that the electric function may not be sufficiently performed. For example, the second electrode 15R extends, over a wide region, from a region (i.e., an element region) where the red organic EL element 100R is provided to its periphery, and is coupled to a ground potential GND in the peripheral region. In such a second electrode 15R, resistance is likely to vary between the element region and the peripheral region. The difference in the resistance in the second electrode 15R causes crosstalk, for example, to occur, thus making image quality likely to be lowered.

As a method for compensating the electric function of the second electrode 15R, methods are conceivable, for example, to stack (i.e., line) a transparent electrically-conductive film on the second electrode 15R and to provide, in the element region, a contact part with respect to the ground potential GND. In the method of lining the transparent electrically-conductive film on the second electrode 15R, for example, a transparent electrically-conductive film having a thickness of about one (1) μm is necessary. Formation of the transparent electrically-conductive film having such a large thickness by means of a vacuum film-forming device leads to a possibility that productivity may be lowered. Further, in this method, light extraction efficiency is lowered due to large thickness of the transparent electrically-conductive film. That is, electric power consumption of the red organic EL device 100R is increased, thus causing the life of the red organic EL device 100R to be shorter. The method for providing, in the element region, the contact part with respect to the ground potential GND is difficult to achieve, taking into consideration the manufacturing process. Furthermore, the contact part narrows the light emission region, thus making the life of the red organic EL device 100R likely to be shorter.

Meanwhile, in the light-emitting device 1, providing the third reflective surfaces S3R, S3B, and S3G, respectively, near the second reflective surfaces S2R, S2B, and S2G allows for reflection, at the third reflective surfaces S3R, S3B, and S3G, of the light outputted from the red light-emitting layer 131R, the light outputted from the blue light-emitting layer 131B, and the light outputted from the green light-emitting layer 131G, respectively, with a similar tendency. In a specific but non-limiting example, the light outputted from the red light-emitting layer 131R, the light outputted from the blue light-emitting layer 131B, and the light outputted from the green light-emitting layer 131G are weakened, respectively, by the interference between the third reflective surface S3R and the light emission center OR, the interference between the third reflective surface S3B and the light emission center OB, and the interference between the third reflective surface S3G and the light emission center OG.

Figure 7A:
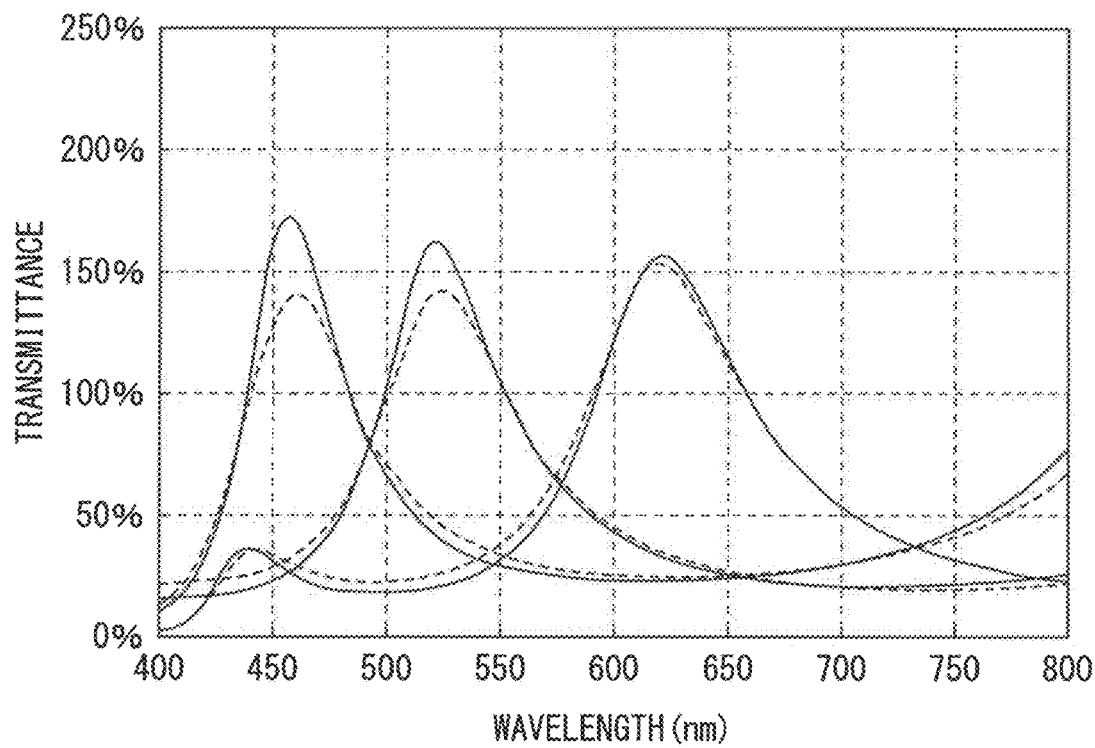
FIG. 7A illustrates transmittance of light of each color extracted from the light-emitting devices illustrated in FIGS. 1 and 6.
Figure 7B:
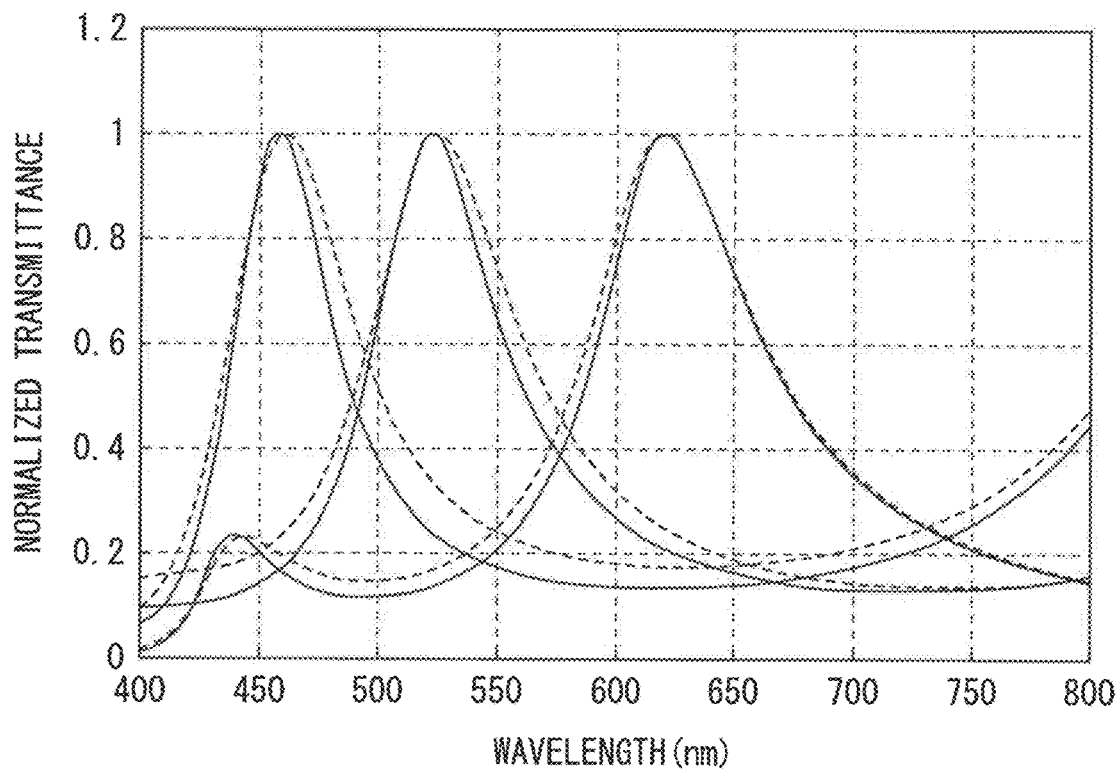
FIG. 7B illustrates normalized transmittance on the basis of the transmittance along a vertical axis illustrated in FIG. 7A.

FIG. 7A illustrates spectral transmittance of the light-emitting device 1, together with spectral transmittance of the light-emitting device 100. FIG. 7B illustrates normalized transmittance, with a peak of light of each color illustrated in FIG. 7A being set as one (1). In FIGS. 7A and 7B, the spectral transmittance of the light-emitting device 1 is indicated by a broken line, whereas the spectral transmittance of the light-emitting device 100 is indicated by a solid line. It is appreciated, from FIG. 7A, that providing the third reflective surfaces S3R, S3B, and S3G uniformly weakens, in the light-emitting device 1, resonance effects of the red organic EL element 10R, the blue organic EL element 10B, and the green organic EL element 10G, as compared with the light-emitting device 100. Further, in the light-emitting device 1, a half value width of a peak of a spectrum of each of the red light LR, the blue light LB, and the green light LG is larger than that in the light-emitting device 100, as illustrated in FIG. 7B. Hence, it becomes possible to suppress change in luminance and occurrence of chromaticity shift that are caused by viewing angle.

This makes it possible, for the light-emitting device 1, to suppress significant lowering of the viewing angle characteristics as compared with the light-emitting device 100, even when thickness of each of the second electrodes 15R, 15B, and 15G is increased. That is, the electric functions of the second electrodes 15R, 15B, and 15G are sufficiently maintained, thus allowing high image quality to be maintained. In addition, increase in electric power consumption is suppressed, thus maintaining a life period of the light-emitting device 1.

Providing the light-emitting device 1 with the third reflective surfaces S3R, S3B, and S3G, respectively, near the second reflective surfaces S2R, S2B, and S2G in this manner makes it possible to uniformly control respective reflections of the light at the third reflective surface S3R, the light at the third reflective surface S3B, and the light at the third reflective surface S3G (i.e., the red light LR, the blue light LB, and the green light LG) over a wide range of wavelengths (e.g., the wavelengths λ1 to λ3). For example, uniformly weakening the resonance effects of the red organic EL element 10R, the blue organic EL element 10B, and the green organic EL element 10G, respectively, at the third reflective surfaces S3R, S3B, and S3G makes it possible to sufficiently maintain the thicknesses of each of the second electrodes 15R, 15B, and 15G and to suppress the lowering of the viewing angle characteristics.

As described above, providing the light-emitting device 1 of the present example embodiment with the third reflective surfaces S3R, S3B, and S3G, respectively, near the second reflective surfaces S2R, S2B, and S2G makes it possible to control the resonance states of the light in a wide range of wavelengths (e.g., the wavelengths λ1 to λ3), i.e., the red light LR, the blue light LB, and the green light LG. For example, it is possible to uniformly weaken the resonance effects of the red organic EL element 10R, the blue organic EL element 10B, and the green organic EL element 10G using, respectively, the third reflective surfaces S3R, S3B, and S3G. This makes it possible to sufficiently maintain the thicknesses of each of the second electrodes 15R, 15B, and 15G and to suppress the lowering of the viewing angle characteristics.

Description is given below of modification examples of the present example embodiment and another example embodiment. In the following description, the same reference numerals are assigned to the same components as those of the foregoing example embodiment, and descriptions thereof are omitted where appropriate.

Modification Example 1

In the light-emitting device 1, the resonance effects of the red organic EL element 10R, the blue organic EL element 10B, and the green organic EL element 10G may be uniformly strengthened using, respectively, the third reflective surfaces S3R, S3B, and S3G.

Similarly to the description in the foregoing first example embodiment, the third reflective surfaces S3R, S3B, and S3G may be each an interface between a high refractive index layer and a low refractive index layer that have different refractive indexes. The third reflective surfaces S3R, S3B, and S3G may be, for example, respective interfaces between the organic layers 13R, 13B, and 13G, and the first transparent layers 14R, 14B, and 14G, as illustrated in FIGS. 2A to 2C. The organic layers 13R, 13B, and 13G each correspond to a specific but non-limiting example of a "high refractive index layer" according to one embodiment of the disclosure. The first transparent layers 14R, 14B, and 14G each correspond to a specific but non-limiting example of a "low refractive index layer" according to one embodiment of the disclosure. The organic layers 13R, 13B, and 13G may each have a refractive index of, for example, 2.0, and the first transparent layers 14R, 14B, and 14G may each have a refractive index of, for example, 1.8. When the third reflective surfaces S3R, S3B, and S3G are disposed, respectively, near the second reflective surfaces S2R, S2B, and 52G, for example, changing stacking order of the low refractive index layer and the high refractive index layer makes it possible to change the resonance effects of the red organic EL element 10R, the blue organic EL element 10B, and the green organic EL element 10G, respectively, at the third reflective surfaces S3R, S3B, and S3G.

At this occasion, as illustrated in FIG. 2A, the optical distance L13 may be so set as to strengthen the light of the center wavelength λ1 of the light emission spectrum of the red light-emitting layer 131R, by interference between the third reflective surface S3R and the light emission center OR. As illustrated in FIG. 2B, the optical distance L23 may be so set as to strengthen the light of the center wavelength λ2 of the light emission spectrum of the blue light-emitting layer 131B, by interference between the third reflective surface S3B and the light emission center OB. As illustrated in FIG. 2C, the optical distance L33 may be so set as to strengthen the light of the center wavelength λ3 of the light emission spectrum of the green light-emitting layer 131G, by interference between the third reflective surface S3G and the light emission center OG.

In a specific but non-limiting example, the optical distances L13, L23, and L33 may be configured to satisfy the following expressions [13] to [16], [36], and [37].

$$2L13/\lambda 13+a3/(2\pi)=m3 \quad [13]$$

$$\lambda 1-150<\lambda 13<\lambda 1+150 \quad [14]$$

$$2L23/\lambda 23+c3/(2\pi)=n3 \quad [15]$$

$$\lambda 2-150<\lambda 23<\lambda 2+150 \quad [16]$$

$$2L33/\lambda 33+b3/(2\pi)=p3 \quad [36]$$

$$\lambda 3-150<\lambda 33<\lambda 3+150 \quad [37]$$

where m3, n3, and p3 each denote an integer,

λ1, λ2, λ3, λ13, λ23, and λ33 are each in unit of nm, a3 denotes a phase change generated upon reflection, at the third reflective surface S3R, of light of each wavelength outputted from the red light-emitting layer 131R, c3 denotes a phase change generated upon reflection, at the third reflective surface S3B, of light of each wavelength outputted from the blue light-emitting layer 131B, and b3 denotes a phase change generated upon reflection, at the third reflective surface S3G, of light of each wavelength outputted from the green light-emitting layer 131G.

The above-mentioned a3, c3, and b3 may be determined in methods similar to those for a1, c1, and b1.

Figure 8:
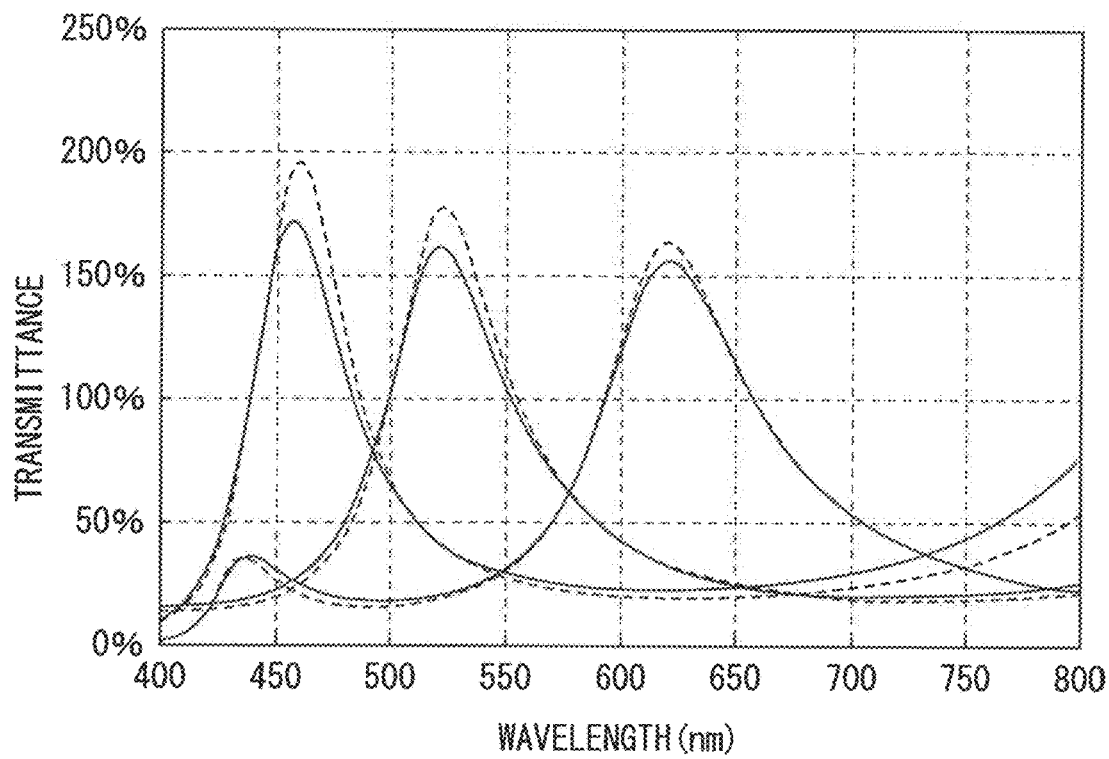
FIG. 8 illustrates transmittance of light of each color extracted from a light-emitting device according to Modification Example 1 and the light-emitting device illustrated in FIG. 6.

FIG. 8 illustrates spectral transmittance of the light-emitting device 1 according to Modification Example 1, together with spectral transmittance of the light-emitting device 100. In FIG. 8, the spectral transmittance of the light-emitting device 1 is indicated by a broken line, whereas the spectral transmittance of the light-emitting device 100 is indicated by a solid line. It is appreciated that providing the third reflective surfaces S3R, S3B, and S3G uniformly strengthens, in the light-emitting device 1, resonance effects of the red organic EL element 10R, the blue organic EL element 10B, and the green organic EL element 10G, as compared with the light-emitting device 100.

As described above, in the light-emitting device 1 according to Modification Example 1, the third reflective surfaces S3R, S3B, and S3G uniformly strengthen respective resonances of the light outputted from the red light-emitting layer 131R, the light outputted from the green light-emitting layer 131G, and the light outputted from the blue light-emitting layer 131B, thus allowing for enhancement in light extraction efficiency. Hence, it becomes possible to suppress electric power consumption and thus to extend the life period of the light-emitting device 1.

Modification Example 2

Figure 9:
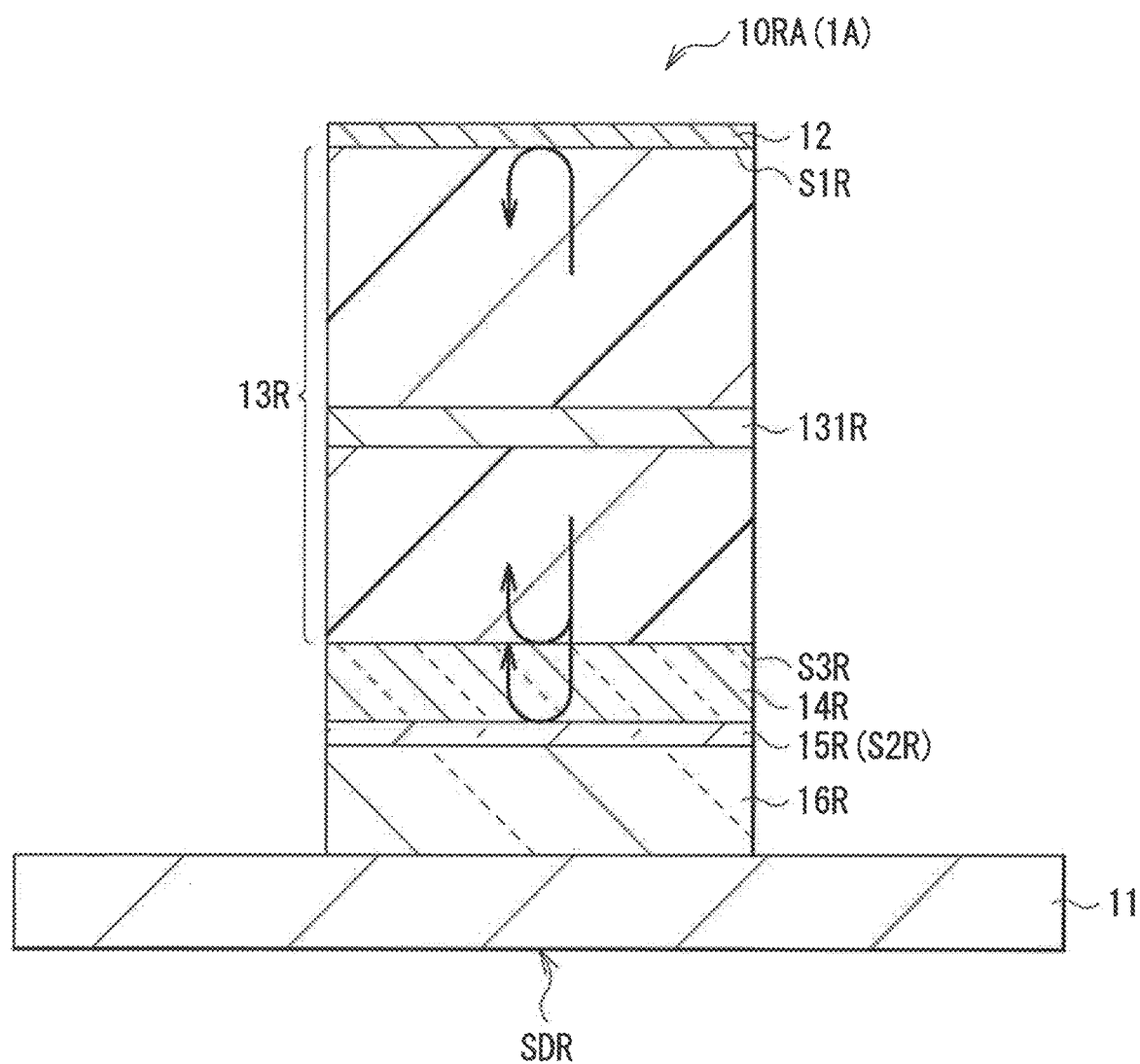
FIG. 9 is a schematic cross-sectional view of a general configuration of a light-emitting device, e.g., a red organic EL element according to Modification Example 2.

FIG. 9 schematically illustrates a cross-sectional configuration of a light-emitting device, i.e., a light-emitting device 1A according to Modification Example 2 of the foregoing first example embodiment. The red organic EL element, i.e., a red organic EL element 10RA provided in the light-emitting device 1A may include, on the substrate 11, the second transparent layer 16R, the second electrode 15R, the first transparent layer 14R, the red organic layer 13R, and the first electrode 12 in this order. In other words, the red organic EL element 10RA may be provided with the second reflective surface S2R, the third reflective surface S3R, and the first reflective surface S1R in this order from the side of the substrate 11. The green organic EL element and the blue organic EL element of the light-emitting device 1A may each also have configurations similar to those of the red organic EL element 10RA. That is, the light-emitting device 1A may be a light-emitting device of a bottom emission type, and may be configured to extract light from the side of the substrate 11.

Second Example Embodiment

Figure 10:
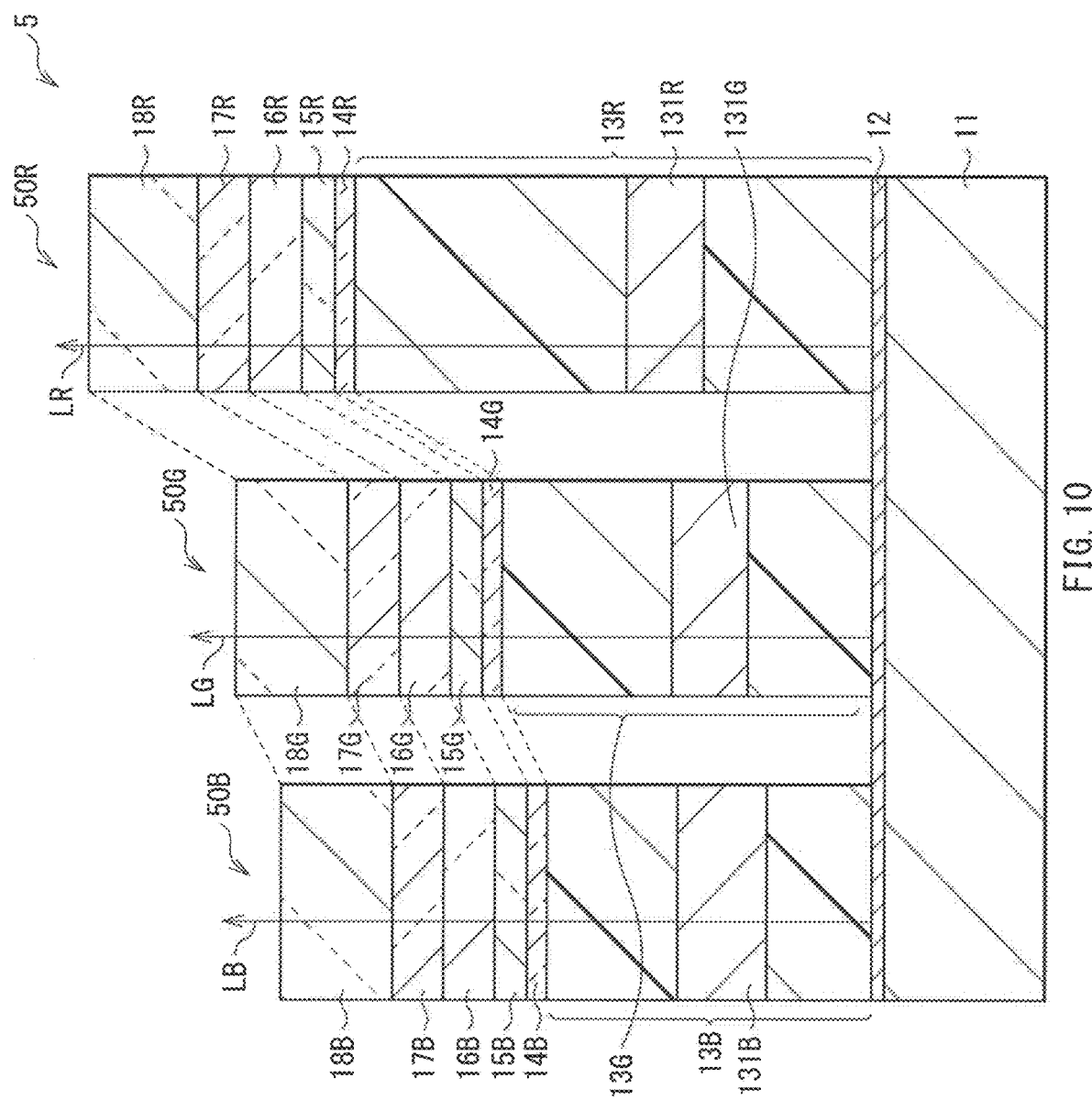
FIG. 10 is a schematic cross-sectional view of a general configuration of a light-emitting device according to one embodiment of the disclosure.

FIG. 10 illustrates a schematic cross-sectional configuration of a light-emitting device, i.e., a light-emitting device 5 according to a second example embodiment. The light-emitting device 5 may include a red organic EL element, i.e., a red organic EL element 50R, a green organic EL element, i.e., a green organic EL element 50G, and a blue organic EL element, i.e., a blue organic EL element 50B. The red organic EL element 50R, the green organic EL element 50G, and the blue organic EL element 50B may include, respectively, on the second transparent layers 16R, 16G, and 16B, the third transparent layers, i.e., third transparent layers 17R, 17G, and 17B and the fourth transparent layers, i.e., fourth transparent layers 18R, 18G, and 18B in this order. In the light-emitting device 5, light of each color is extracted from sides of the fourth transparent layers 18R, 18G, and 18B. That is, the red light LR is extracted from side of the fourth transparent layer 18R. The green light LG is extracted from side of the fourth transparent layer 18G. The blue light LB is extracted from side of the fourth transparent layer 18B. Except this point, the light-emitting device 5 has configurations similar to those of the light-emitting device 1 according to the foregoing first example embodiment. Workings and effects of the light-emitting device 5 are also similar to those of the light-emitting device 1 according to the foregoing first example embodiment.

Figure 11A:
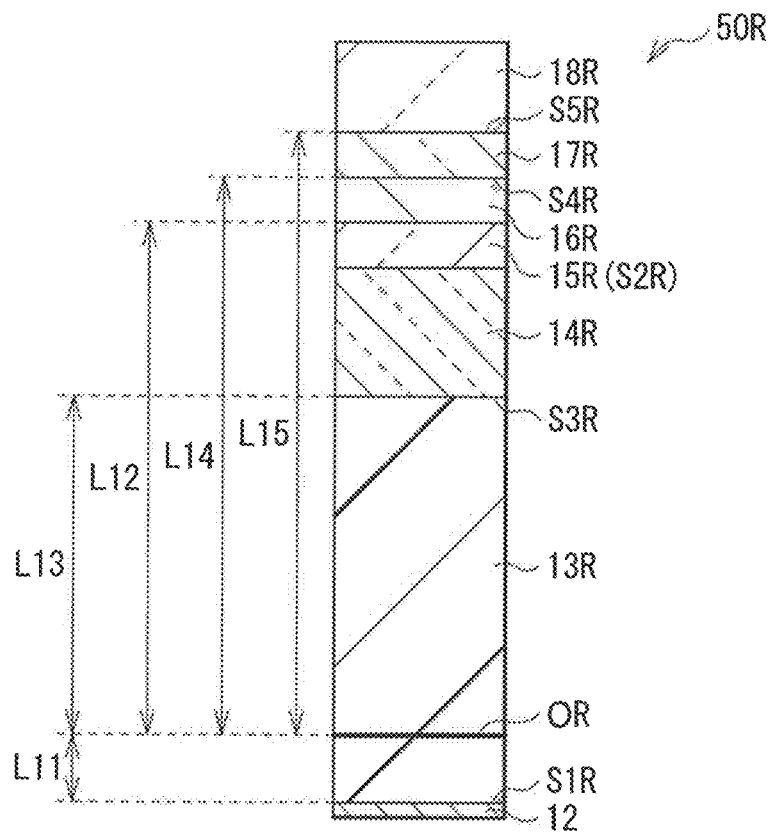
FIG. 11A is a schematic cross-sectional view of a resonance structure of a red organic EL element illustrated in FIG. 10.
Figure 11B:
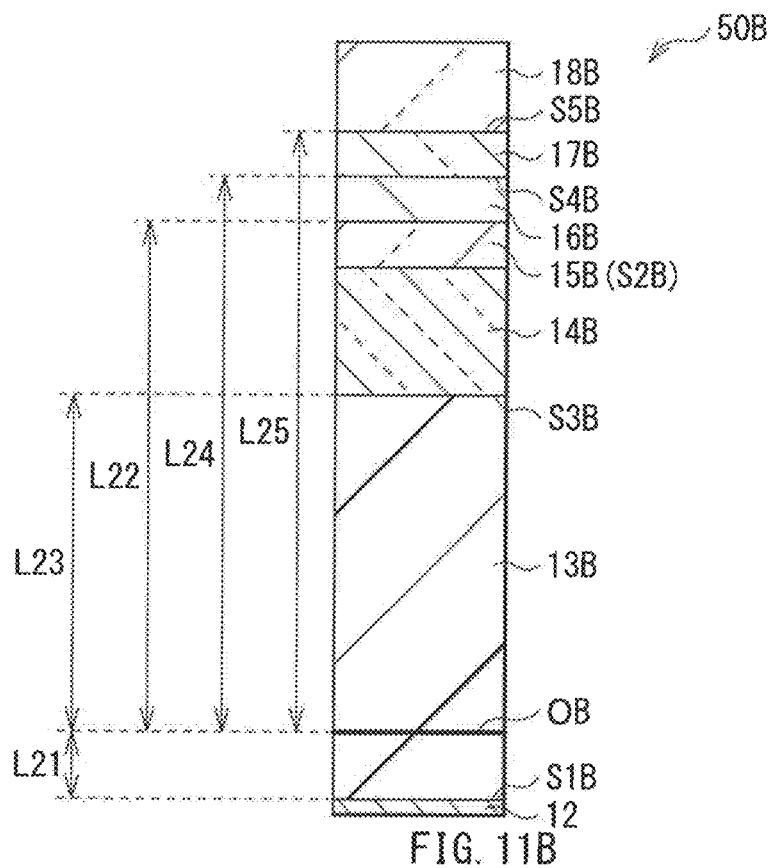
FIG. 11B is schematic cross-sectional view of a resonance structure of a blue organic EL element illustrated in FIG. 10.
Figure 11C:
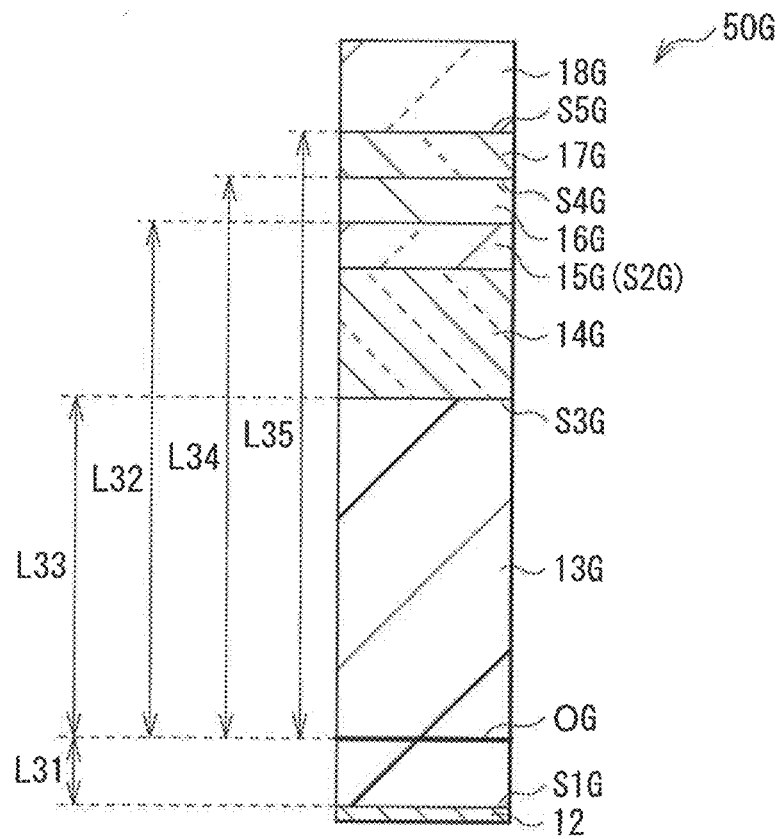
FIG. 11C is schematic cross-sectional view of a resonance structure of a green organic EL element illustrated in FIG. 10.

FIGS. 11A, 11B, and 11C illustrate respective resonator structures of the red organic EL element 50R, the blue organic EL element 50B, and the green organic EL element 50G.

The red organic EL element 50R may include the first reflective surface S1R, the third reflective surface S3R, the second reflective surface S2R, a fourth reflective surface S4R, and a fifth reflective surface S5R in this order from the side of the substrate 11, as illustrated in FIG. 11A. The third transparent layer 17R and the fourth transparent layer 18R may each face the red organic layer 13R with the second reflective surface S2R being interposed therebetween. The third transparent layer 17R and the fourth transparent layer 18R may be each disposed at a location more distant from the light emission center OR than the second reflective surface S2R.

The blue organic EL element 50B may include the first reflective surface S1B, the third reflective surface S3B, the second reflective surface S2B, a fourth reflective surface S4B, and a fifth reflective surface S5B in this order from the side of the substrate 11, as illustrated in FIG. 11B. The third transparent layer 17B and the fourth transparent layer 18B may each face the blue organic layer 13B with the second reflective surface S2B being interposed therebetween. The third transparent layer 17B and the fourth transparent layer 18B may be each disposed at a location more distant from the light emission center OB than the second reflective surface S2B.

The green organic EL element 50G may include the first reflective surface S1G, the third reflective surface S3G, the second reflective surface S2G, a fourth reflective surface S4G, and a fifth reflective surface S5G in this order from the side of the substrate 11, as illustrated in FIG. 11C. The third transparent layer 17G and the fourth transparent layer 18G may each face the green organic layer 13G with the second reflective surface S2G being interposed therebetween. The third transparent layer 17G and the fourth transparent layer 18G may be each disposed at a location more distant from the light emission center OG than the second reflective surface S2G.

The red organic EL element 50R, the blue organic EL element 50B, and the green organic EL element 50G may include the fourth reflective surfaces S4R, S4B, and S4G, and the fifth reflective surfaces S5R, S5B, and S5G, respectively, in addition to the first reflective surfaces S1R, SIB, and S1G, the second reflective surfaces S2R, S2B, and S2G, the third reflective surfaces S3R, S3B, and S3G described in the foregoing first example embodiment.

The fourth reflective surface S4R may be provided between the second reflective surface S2R and the fifth reflective surface S5R, and may be an interface, for example, between the second transparent layer 16R and the third transparent layer 17R. The fourth reflective surface S4B may be provided between the second reflective surface S2B and the fifth reflective surface S5B, and may be an interface, for example, between the second transparent layer 16B and the third transparent layer 17B. The fourth reflective surface S4G may be provided between the second reflective surface S2G and the fifth reflective surface S5G, and may be an interface, for example, between the second transparent layer 16G and the third transparent layer 17G. The fourth reflective surfaces S4R may be formed by a refractive index difference between a constituent material of the second transparent layer 16R and a constituent material of the third transparent layer 17R. The fourth reflective surfaces S4B may be formed by a refractive index difference between a constituent material of the second transparent layer 16B and a constituent material of the third transparent layer 17B. The fourth reflective surfaces S4G may be formed by a refractive index difference between a constituent material of the second transparent layer 16G and a constituent material of the third transparent layer 17G. For example, silicon nitride (SiN) that constitutes the second transparent layers 16R, 16B, and 16G may have a refractive index of 1.95, and silicon oxynitride (SiON) that constitutes the third transparent layers 17R, 17B, and 17G may have a refractive index of 1.65. The second transparent layers 16R, 16B, and 16G may be each configured by IZO having a refractive index of 2.0.

The fourth reflective surface S4R may be located at an optical distance L14 from the light emission center OR. The fourth reflective surface S4B may be located at an optical distance L24 from the light emission center OB. The fourth reflective surface S4G may be located at an optical distance L34 from the light emission center OG. In one embodiment, the fourth reflective surfaces S4R, S4B, and S4G may be located at an optical distance of 450 nm or less from the second reflective surfaces S2R, S2B, and S2G, respectively. One reason for this is that respective large distances from the second reflective surface S2R to the fourth reflective surface S4R, from the second reflective surface S2B to the fourth reflective surface S4B, and from the second reflective surface S2G to the fourth reflective surface S4G make it difficult to obtain effects produced by the resonator structure.

The fifth reflective surface S5R may face the second reflective surface S2R with the fourth reflective surface S4R being interposed therebetween. The fifth reflective surface S5R may be an interface, for example, between the third transparent layer 17R and the fourth transparent layer 18R. The fifth reflective surface S5B may face the second reflective surface S2B with the fourth reflective surface S4B being interposed therebetween. The fifth reflective surface S5B may be an interface, for example, between the third transparent layer 17B and the fourth transparent layer 18B. The fifth reflective surface S5G may face the second reflective surface S2G with the fourth reflective surface S4G being interposed therebetween. The fifth reflective surface S5G may be an interface, for example, between the third transparent layer 17G and the fourth transparent layer 18G. The fifth reflective surface S5R may be formed by a refractive index difference between a constituent material of the third transparent layer 17R and a constituent material of the fourth transparent layer 18R. The fifth reflective surface S5B may be formed by a refractive index difference between a constituent material of the third transparent layer 17B and a constituent material of the fourth transparent layer 18B. The fifth reflective surface S5G may be formed by a refractive index difference between a constituent material of the third transparent layer 17G and a constituent material of the fourth transparent layer 18G. Silicon oxynitride (SiON) that constitutes the third transparent layers 17R, 17B, and 17G may have a refractive index of 1.65, and silicon nitride (SiN) that constitutes the fourth transparent layers 18R, 18B, and 18G may have a refractive index of 1.95.

The fifth reflective surface S5R may be located at an optical distance L15 from the light emission center OR. The fifth reflective surface S5B may be located at an optical distance L25 from the light emission center OB. The fifth reflective surface S5G may be located at an optical distance L35 from the light emission center OG. In one embodiment, the fifth reflective surfaces S5R, S5B, and S5G may be located at an optical distance of 380 nm or less from the second reflective surfaces S2R, S2B, and 52G, respectively. One reason for this is that respective large distances from the second reflective surface S2R to the fifth reflective surface S5R, from the second reflective surface S2B to the fifth reflective surface S5B, and from the second reflective surface S2G to the fifth reflective surface S5G make it difficult to obtain effects produced by the resonator structure.

The fourth reflective surfaces S4R, S4B, and S4G and the fifth reflective surfaces S5R, S5B, and S5G may be each formed by stacking thereon a thin metal film having a thickness of 5 nm or more, for example.

In the light-emitting device 5 of the present example embodiment, the optical distance L14 may be so set as to weaken the light of the center wavelength λ1 of the light emission spectrum of the red light-emitting layer 131R, by interference between the fourth reflective surface S4R and the light emission center OR. Meanwhile, the optical distance L24 may be so set as to strengthen the light of the center wavelength λ2 of the light emission spectrum of the blue light-emitting layer 131B, by interference between the fourth reflective surface S4B and the light emission center OB. In addition, the optical distance L34 may be so set as to strengthen the light of the center wavelength λ3 of the light emission spectrum of the green light-emitting layer 131G, by interference between the fourth reflective surface S4G and the light emission center OG.

Further, the optical distance L15 may be so set as to weaken the light of the center wavelength λ1 of the light emission spectrum of the red light-emitting layer 131R, by interference between the fifth reflective surface S5R and the light emission center OR. Meanwhile, the optical distance L25 may be so set as to strengthen the light of the center wavelength λ2 of the light emission spectrum of the blue light-emitting layer 131B, by interference between the fifth reflective surface S5B and the light emission center OB. In addition, the optical distance L35 may be so set as to strengthen the light of the center wavelength λ3 of the light emission spectrum of the green light-emitting layer 131G, by interference between the fifth reflective surface S5G and the light emission center OG.

In a specific but non-limiting example, the optical distances L14, L24, L34, L15, L25, and L35 may be configured to satisfy the following expressions [17] to [24] and [38] to [41].

$$2L14/\lambda14 + a4/(2\pi) = m4 + \tfrac{1}{2} \quad [17]$$

$$2L15/\lambda15 + a5/(2\pi) = m5 + \tfrac{1}{2} \quad [18]$$

$$\lambda1 - 150 < \lambda14 < \lambda1 + 150 \quad [19]$$

$$\lambda1 - 150 < \lambda15 < \lambda1 + 150 \quad [20]$$

$$2L24/\lambda24 + c4/(2\pi) = n4 \quad [21]$$

$$2L25/\lambda25 + c5/(2\pi) = n5 \quad [22]$$

$$\lambda2 - 150 < \lambda24 < \lambda2 + 150 \quad [23]$$

$$\lambda2 - 150 < \lambda25 < \lambda2 + 150 \quad [24]$$

$$2L34/\lambda34 + b4/(2\pi) = p4 \quad [38]$$

$$2L35/\lambda35 + b5/(2\pi) = p5 \quad [39]$$

$$\lambda3 - 150 < \lambda34 < \lambda3 + 150 \quad [40]$$

$$\lambda3 - 150 < \lambda35 < \lambda3 + 150 \quad [41]$$

where m4, m5, n4, n5, p4, and p5 each denote an integer,

λ1, λ2, λ3, λ14, λ15, λ24, λ25, λ34, and λ35 are each in unit of nm, a4 denotes a phase change generated upon reflection, at the fourth reflective surface S4R, of light of each wavelength outputted from the red light-emitting layer 131R, a5 denotes a phase change generated upon reflection, at the fifth reflective surface S5R, of light of each wavelength outputted from the red light-emitting layer 131R, c4 denotes a phase change generated upon reflection, at the fourth reflective surface S4B, of light of each wavelength outputted from the blue light-emitting layer 131B, c5 denotes a phase change generated upon reflection, at the fifth reflective surface S5B, of light of each wavelength outputted from the blue light-emitting layer 131B, b4 denotes a phase change generated upon reflection, at the fourth reflective surface S4G, of light of each wavelength outputted from the green light-emitting layer 131G, and b5 denotes a phase change generated upon reflection, at the fifth reflective surface S5G, of light of each wavelength outputted from the green light-emitting layer 131G.

The above-mentioned a4, c4, b4, a5, c5, and b5 may be determined in methods similar to those for a1, c1, and b1.

It is possible, for the light-emitting device 5, to thus allow conditions of the reflection at the fourth reflection surfaces S4R, S4B, and S4G and at the fifth reflection surfaces S5R, S5B, and S5G to be different among the red organic EL element 50R, the blue organic EL element 50B, and the green organic EL element 50G. Hence, it is possible to adjust light emission states for each of the light-emitting elements, i.e., the red organic EL element 50R, the blue organic EL element 50B, and the green organic EL element 50G. This makes it possible to enhance viewing angle characteristics, as described later in greater detail.

Figure 12:
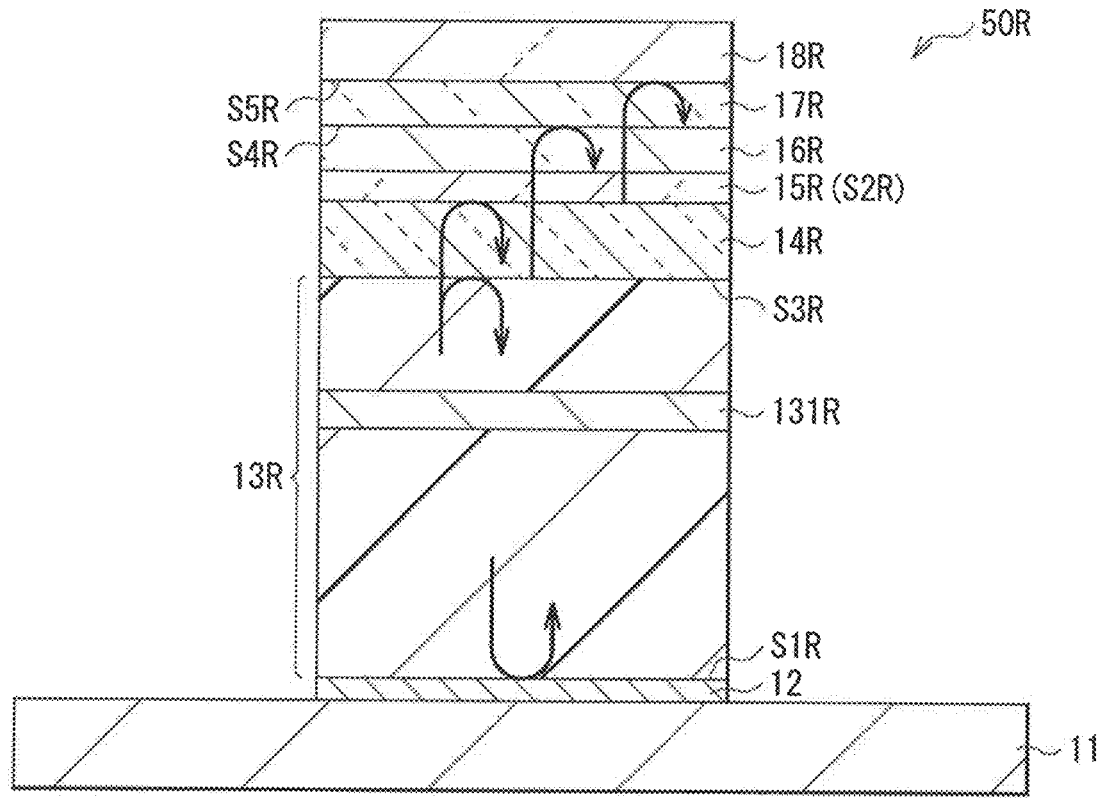
FIG. 12 is a schematic cross-sectional view that describes an operation of the light-emitting device illustrated in FIG. 10.

As illustrated in FIG. 12, in the red organic EL element 50R, the light outputted from the red light-emitting layer 131R is subjected to the multiple reflection between the first reflective surfaces S1R and the fifth reflective surface S5R, and the red light LR is extracted from the side of the fourth transparent layer 18R. In the blue organic EL element 50B and the green organic EL element 50G as well, similar multiple reflection causes the blue light LB and the green light LG to be extracted, respectively.

As described above, the light-emitting device having the resonator structure is likely to have large angle dependency. In particular, in a case where wavelength dispersion of refractive indexes occurs because of a spectrum of light outputted from each of the light-emitting layers, it becomes difficult to improve the angle dependency. In the wavelength dispersion of the refractive indexes, there occur differences in the effects of the resonator structures among the red organic EL element, the green organic EL element, and the blue organic EL element, because of a difference in the refractive indexes of the constituent materials depending on wavelength. For example, in the red organic EL element, a peak of the red light to be extracted may become too steep. In the blue organic EL element, a peak of the blue light to be extracted may be moderated too much. Such a large difference in the effects of the resonator structures for each element may result in large angle dependency of luminance and hues.

Further, increased thickness of the second electrode is likely to increase the difference in the effects of the resonator structures between the elements. One reason for this is that a refractive index and an extinction coefficient of a constituent material of the second electrode exert a large influence on optical characteristics of the second electrode, with the refractive index and the extinction coefficient each having wavelength dependency.

In the light-emitting device 5 of the present example embodiment, influences of the fourth reflective surface S4R and the fifth reflective surface S5R on the light generated in the red light-emitting layer 131R differs from influences of the fourth reflective surface S4B and the fifth reflective surface S5B on the light generated in the blue light-emitting layer 131B. In addition, influences of the fourth reflective surface S4R and the fifth reflective surface S5R on the light generated in the red light-emitting layer 131R differs from influences of the fourth reflective surface S4G and the fifth reflective surface S5G on the light generated in the green light-emitting layer 131G. In a specific but non-limiting example, the light generated in the red light-emitting layer 131R as well as the light generated in the blue light-emitting layer 131B and the light generated in the green light-emitting layer 131G act as follows.

The light generated in the red light-emitting layer 131R is weakened by interference between the light emission center OR of the red light-emitting layer 131R and the fourth reflective surface S4R as well as the fifth reflective surface S5R. Meanwhile, the light generated in the blue light-emitting layer 131B is strengthened by interference between the light emission center OB of the blue light-emitting layer 131B and the fourth reflective surface S4B as well as the fifth reflective surface S5B. In addition, the light generated in the green light-emitting layer 131G is strengthened by interference between the light emission center OG of the green light-emitting layer 131G and the fourth reflective surface S4G as well as the fifth reflective surface S5G.

Accordingly, in the red organic EL element 50R, the red light LR having a moderate spectrum near a peak is extracted. In the blue organic EL element 50B and the green organic EL element 50G, respectively, the blue light LB having a spectrum with a steep peak and the green light LG having a spectrum with a steep peak are extracted. Thus, the difference between the effects of the resonator structure of the red organic EL element 50R and the effects of each of the resonator structure of the blue organic EL element 50B and the green organic EL element 50G becomes small, leading to small angle dependency of the luminance and the hues.

Figure 13:
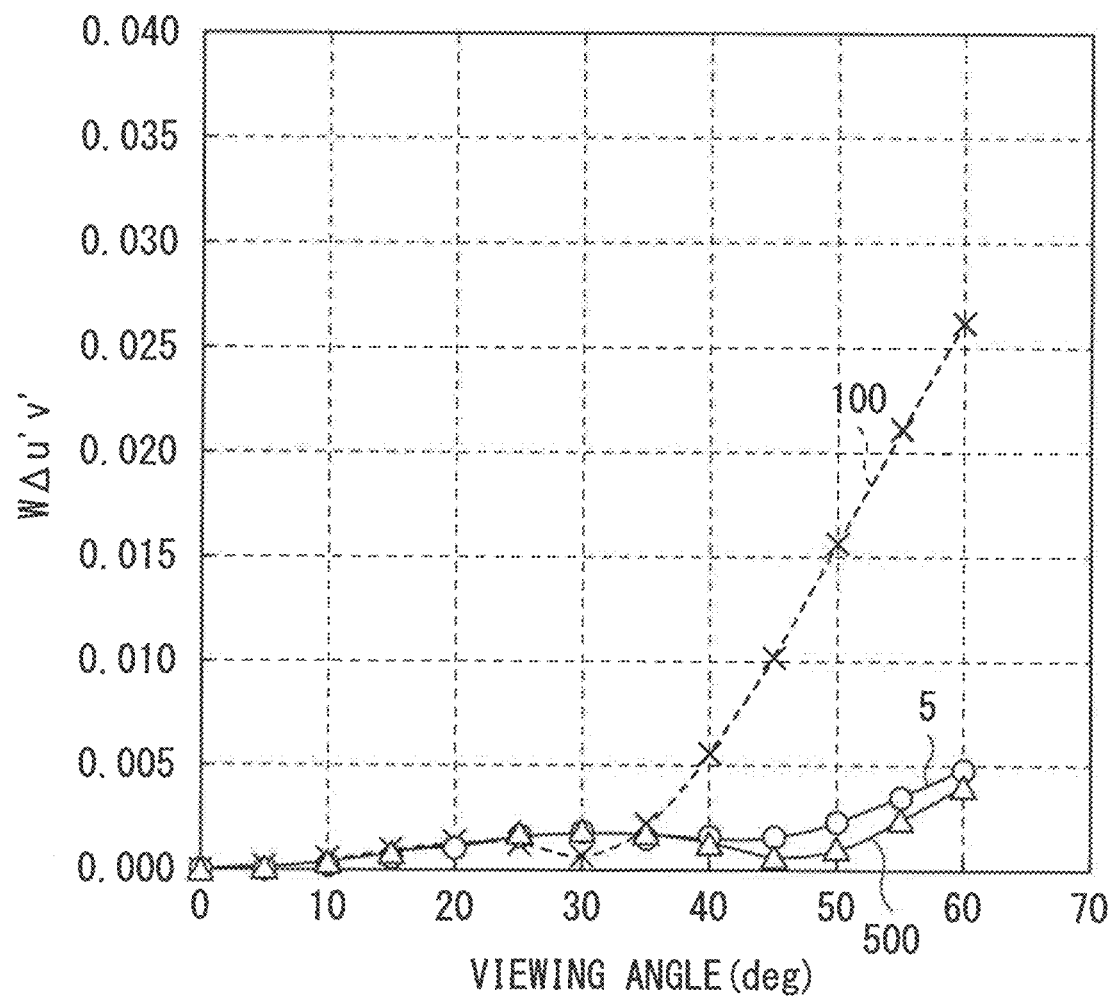
FIG. 13 illustrates viewing angle characteristics of the light-emitting device illustrated in FIG. 10.

FIG. 13 illustrates viewing angle characteristics of the light-emitting device 5, together with viewing angle characteristics of each of light-emitting devices 100 and 500 according to Comparative Examples 1 and 2, respectively.

Figure 14:
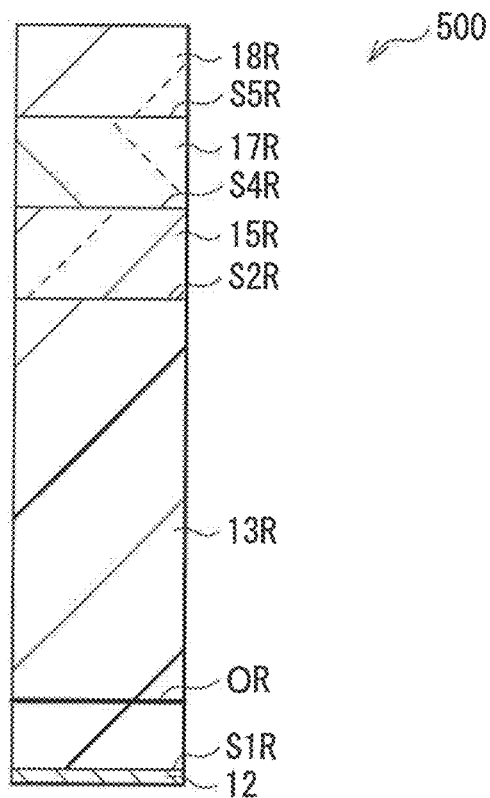
FIG. 14 is a schematic cross-sectional view illustrating a configuration of a light-emitting device according to Comparative Example 2.

FIG. 14 illustrates a schematic cross-sectional configuration of the light-emitting device 500 according to Comparative Example 2. FIG. 14 illustrates a cross-sectional configuration of the red organic EL element; however, the blue organic EL element and the green organic EL element also have configurations similar to those of the red organic EL element. The light-emitting device 500 includes the first electrode 12, an organic layer (i.e., the red organic layer 13R), a second electrode (i.e., the second electrode 15R), a third transparent layer (i.e., the third transparent layer 17R), and a fourth transparent layer (i.e., the fourth transparent layer 18R) in this order. The light-emitting device 500 includes a first reflective surface (i.e., the first reflective surface S1R), a second reflective surface (i.e., the second reflective surface S2R), a fourth reflective surface (i.e., the fourth reflective surface S4R), and a fifth reflective surface (i.e., the fifth reflective surface S5R) in this order. In other words, the light-emitting device 500 includes no third reflective surface (e.g., the third reflective surface S3R in FIG. 11A).

It is possible to confirm, from FIG. 13, that viewing angle characteristics of each of the light-emitting devices 5 and 500 are significantly improved, as compared with the viewing angle characteristics of the light-emitting device 100. In the light-emitting device 500, the second electrode (i.e., the second electrode 15R) is configured by silver (Ag) having a thickness of 11 nm, for example. Setting the thickness of the second electrode to, for example, 13 nm deteriorates the viewing angle characteristics, causing Δu'v' to amount to nearly 0.010 at a viewing angle of 60°, although unillustrated. Meanwhile, in the light-emitting device 5, even in a case where the second electrodes 15R, 15B, and 15G are each configured by silver (Ag) having a thickness of 13 nm, Δu'v' is less than 0.005 (i.e., Δu'v'<0.005) as illustrated in FIG. 13. In other words, even the light-emitting device 5 including the second electrodes 15R, 15B, and 15G having larger thickness (i.e., a thickness of 13 nm) secures viewing angle characteristics equivalent to those of the light-emitting device 500 including the second electrode having a thickness of 11 nm.

Moreover, the light-emitting device 5 may be suitable for a case where the organic layers, i.e., the red organic layer 13R, the blue organic layer 13B, and the green organic layer 13G are each a printed layer. The organic layer is subjected to, for example, a drying process, and thus is likely to have unevenness in thickness for each element. In other words, the organic layer is likely to have thickness distribution. In the light-emitting device 5, it is possible to adjust the difference in the effects of the resonator structures for each element region, caused by the thickness distribution.

As described above, in the light-emitting device 5 of the present example embodiment, the fourth reflective surface S4R and the fifth reflective surface S5R of the red organic EL element 50R may be provided to weaken the light generated in the red light-emitting layer 131R. Meanwhile, the fourth reflective surface S4B and the fifth reflective surface S5B of the blue organic EL element 50B and the fourth reflective surface S4G and the fifth reflective surface S5G of the green organic EL element 50G may be provided to strengthen, respectively, the light generated in the blue light-emitting layer 131B and the light generated in the green light-emitting layer 131G. This makes it possible to adjust the effects of the resonator structures for each element, thus enabling the viewing angle characteristics to be further enhanced. Furthermore, even when the thickness of each of the second electrodes 15R, 15B, and 15G is increased, lowering of the viewing angle characteristics is suppressed.

Modification Example 1

Figure 15:
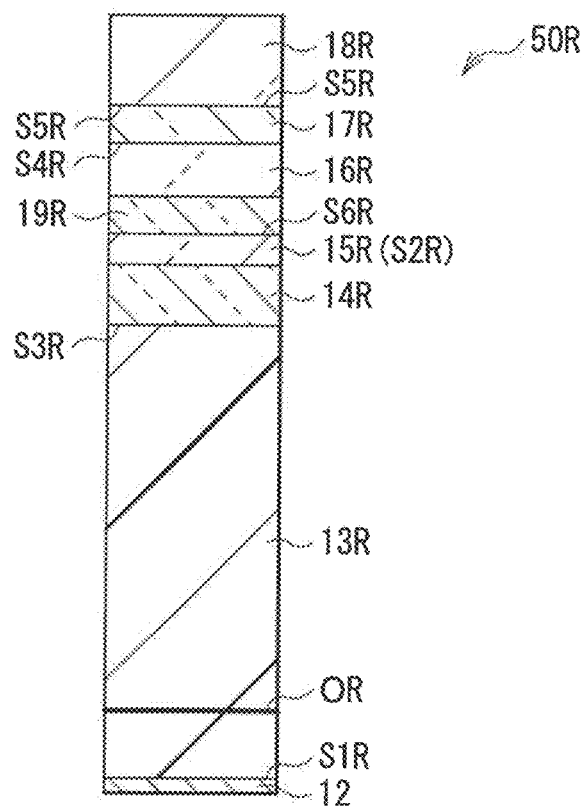
FIG. 15 is a schematic cross-sectional view of a configuration of a light-emitting device, e.g., a red organic EL element according to Modification Example 3.

FIG. 15 schematically illustrates a cross-sectional configuration of the red organic EL element 50R according to a modification example of the foregoing second example embodiment, i.e., Modification Example 3. The red organic EL element 50R may include a sixth reflective surface, i.e., a sixth reflective surface S6R, in addition to the first reflective surface S1R, the second reflective surface S2R, the third reflective surface S3R, the fourth reflective surface S4R, and the fifth reflective surface S5R. The red organic EL element 50R may include a fifth transparent layer, i.e., a fifth transparent layer 19R, for example, between the second electrode 15R and the second transparent layer 16R.

The sixth reflective surface S6R may be provided, for example, between the second reflective surface S2R and the fourth reflective surface S4R. The sixth reflective surface S6R may be an interface, for example, between the second electrode 15R and the fifth transparent layer 19R, and may be formed by a refractive index difference between a constituent material of the second electrode 15R and a constituent material of the fifth transparent layer 19R.

The sixth reflective surface S6R may be provided between the fourth reflective surface S4R and the fifth reflective surface S5R, although unillustrated. In an alternative embodiment, the sixth reflective surface S6R may be provided at a location that faces the fourth reflective surface S4R with the fifth reflective surface S5R being interposed therebetween. At this occasion, in one embodiment, the sixth reflective surface S6R may be located at an optical distance of 1,200 nm or less from the second reflective surface S2R. A plurality of sixth reflective surfaces S6R may be provided.

Reflection at the sixth reflective surface S6R may be configured to cause weakening or to cause strengthening with respect to the center wavelength λ1 of the light emission spectrum of the red light-emitting layer 131R. With the plurality of sixth reflective surfaces S6R being provided, all of the plurality of sixth reflective surfaces S6R may be configured to cause weakening or to cause strengthening with respect to the center wavelength λ1 of the light emission spectrum of the red light-emitting layer 131R. With the plurality of sixth reflective surfaces S6R being provided, some of the plurality of sixth reflective surfaces S6R may be configured to cause weakening, while others of the plurality of sixth reflective surfaces S6R may be configured to cause strengthening, with respect to the center wavelength λ1 of the light emission spectrum of the red light-emitting layer 131R.

The green organic EL element 50G and the blue organic EL element 50B may each include the sixth reflective surface.

Providing the sixth reflective surface S6R makes it possible to adjust the effects of the resonator structure more finely.

Application Example 1

Any of the light-emitting devices 1, 1A, and 5 as described, for example, in the foregoing example embodiments is applicable to, for example, a display unit, i.e., a display unit 2 in FIG. 16 described later. Applying any of the light-emitting devices 1, 1A, and 5 each having high viewing angle characteristics to the display unit leads to small angle dependency of the luminance and the hues, thus allowing for high image quality.

Figure 16:
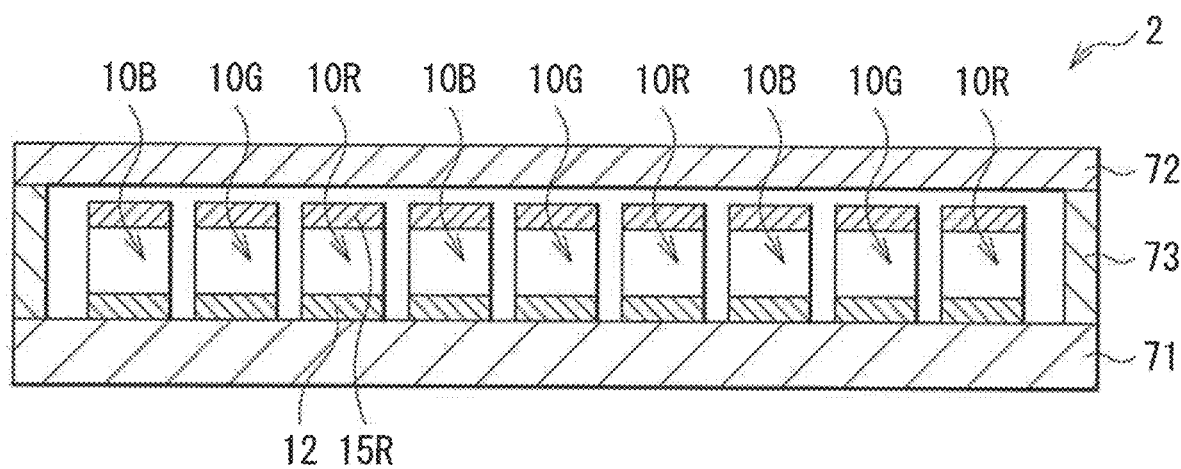
FIG. 16 is a schematic cross-sectional view of a configuration of a display unit to which any of the light-emitting devices illustrated in FIG. 1 and other figures is applied.

FIG. 16 illustrates a schematic cross-sectional configuration of the display unit, i.e., the display unit 2 to which any of the light-emitting devices 1, 1A, and 5 is applied. The display unit 2 may be an active-matrix display unit, and may include a drive substrate 71. The display unit 2 may include a sealing substrate 72 that faces the drive substrate 71. The display unit 2 may further include, between the drive substrate 71 and the sealing substrate 72, the red organic EL element 10R, the green organic EL element 10G, and the blue organic EL element 10B. In an alternative embodiment, the display unit 2 may include, between the drive substrate 71 and the sealing substrate 72, the red organic EL element 50R, the green organic EL element 50G, and the blue organic EL element 50B. Outer peripheries of each of the drive substrate 71 and the sealing substrate 72 may be sealed by a sealing agent 73. In the display unit 2, an image may be displayed on side of the sealing substrate 72, for example. The display unit 2 may provide either monochrome display or color display.

The drive substrate 71 may include a thin film transistor as a drive element for each pixel. The drive substrate 71 may include not only the thin film transistor but also scanning lines, current supply lines, and data lines that drive each thin film transistor. The thin film transistor of each pixel may be supplied with a corresponding display signal for each display pixel. The pixel may be driven in accordance with the display signal, and the image may be displayed.

Figure 17:
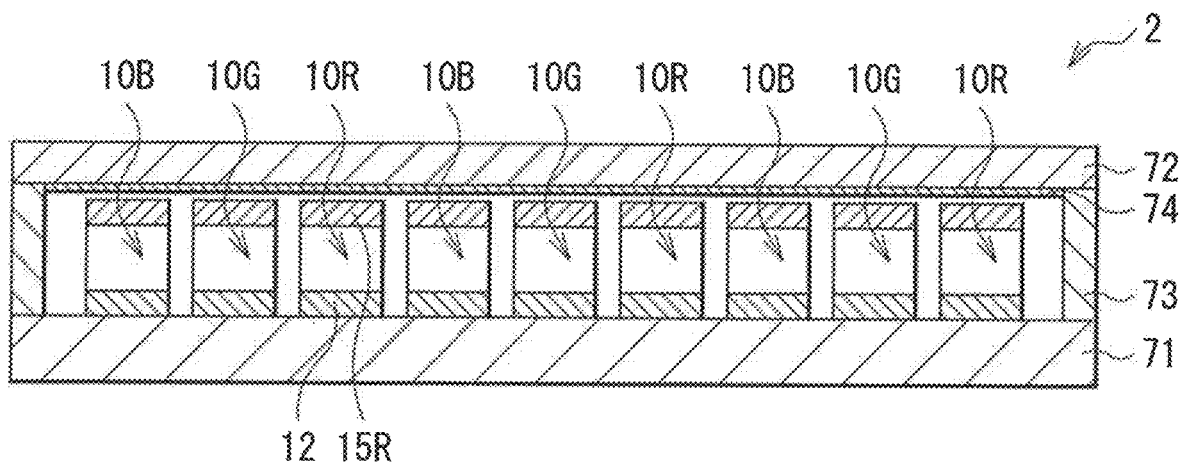
FIG. 17 is a cross-sectional view of another example of the display unit illustrated in FIG. 16.

As illustrated in FIG. 17, the display unit 2 may include a color filter layer 74. The color filter layer 74 may be provided, for example, on one surface of the sealing substrate 72, i.e., on a surface that faces the drive substrate 71.

In the color filter layer 74, color filters corresponding to colors of red, green, and blue may be provided for respective pixels.

Figure 18:
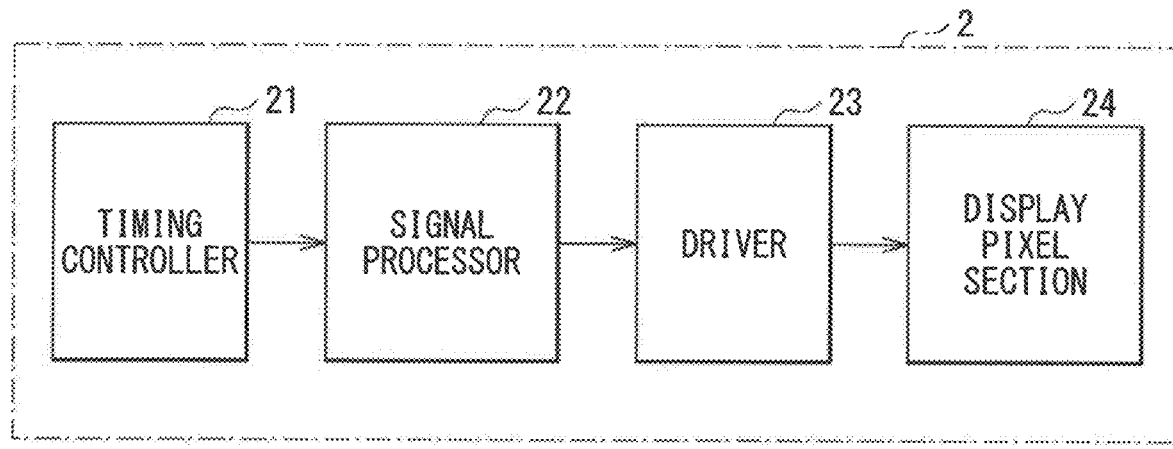
FIG. 18 is a block diagram illustrating a configuration of the display unit illustrated in FIG. 16.

FIG. 18 illustrates a functional block configuration of the display unit 2.

The display unit 2 may display a picture on the basis of a picture signal inputted from the outside or a picture signal generated inside. The display unit 2 may be applied not only to the organic EL display as described above but also to a liquid crystal display, for example. The display unit 2 may include, for example, a timing controller 21, a signal processor 22, a driver 23, and a display pixel section 24.

The timing controller 21 may include a timing generator that generates various timing signals, i.e., control signals. On the basis of these various timing signals, the timing controller 21 may perform a drive control of the signal processor 22, for example. The signal processor 22 may perform, for example, a predetermined correction on a digital picture signal inputted from the outside, and may output, to the driver 23, a picture signal thus obtained. The driver 23 may include, for example, a scanning line drive circuit and a signal line drive circuit, and may drive each pixel of the display pixel section 24 through various control lines. The display pixel section 24 may include the organic EL elements such as the red organic EL element 10R, the green organic EL element 10G, and the blue organic EL element 10B, and a pixel circuit that drives the organic EL elements on a pixel basis. Out of the above-described components, for example, the driver 23 may be configured by the drive substrate 71.

[Example of Electronic Apparatus]

Figure 19:
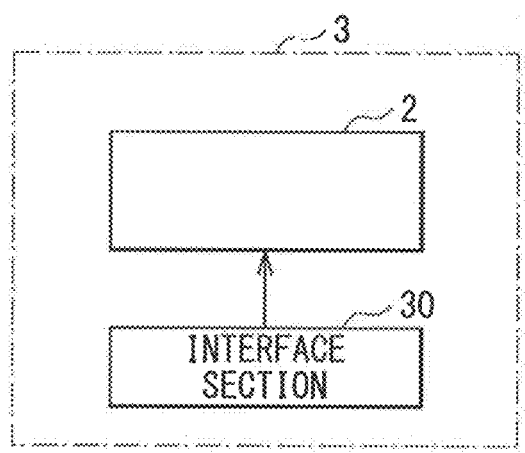
FIG. 19 is a block diagram illustrating a configuration of an electronic apparatus to which the display unit illustrated in FIG. 18 is applied.

The display unit 2 may be used in various types of electronic apparatuses. FIG. 19 illustrates a functional block configuration of an electronic apparatus 3. Non-limiting examples of the electronic apparatus 3 may include a television, a personal computer (PC), a smartphone, a tablet PC, a mobile phone, a digital still camera, and a digital video camera.

The electronic apparatus 3 may include, for example, the display unit 2 as described above, and an interface section 30. The interface section 30 may be an input section to which, for example, various signals and power are inputted from the outside. The interface section 30 may further include, for example, a user interface such as a touch panel, a keyboard, and an operation button.

Application Example 2

Any of the light-emitting devices 1, 1A, and 5 as described, for example, in the foregoing example embodiments is applicable to, for example, an illumination apparatus, i.e., an illumination unit 410 in FIG. 20 described later. Any of the light-emitting devices 1, 1A, and 5 is applicable to light sources for illumination apparatuses in any fields, such as illumination apparatuses for table lighting or floor lighting, and illumination apparatuses for room lighting.

Figure 20:
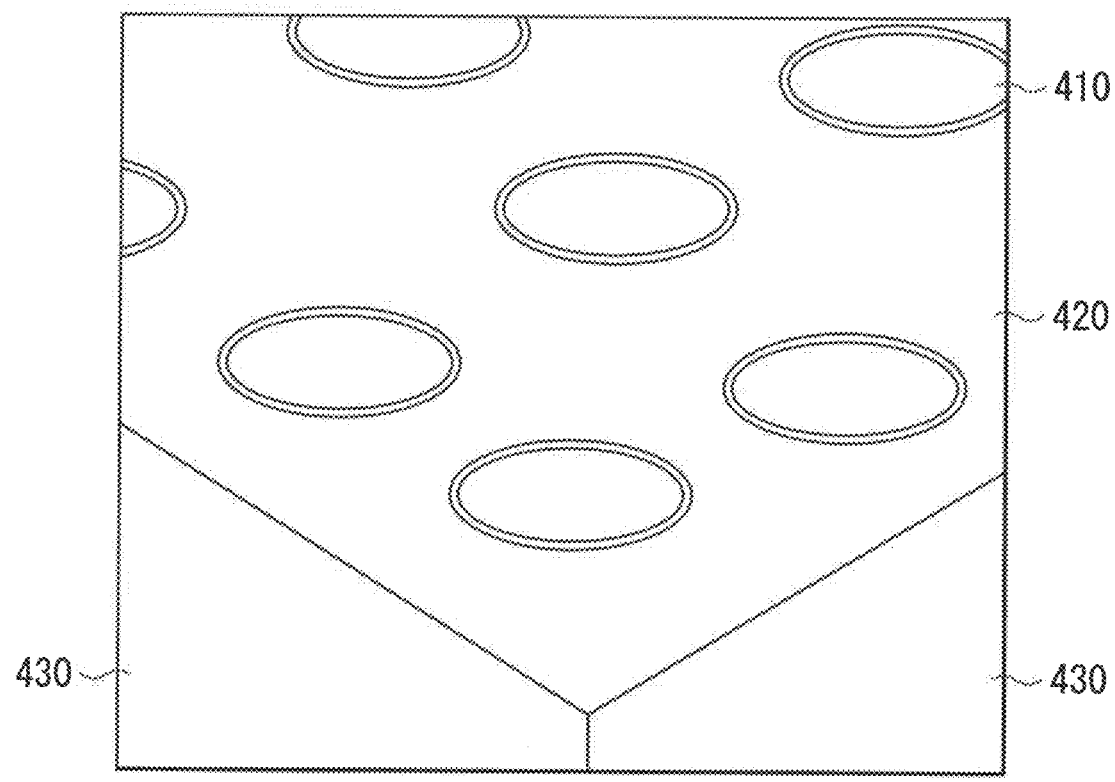
FIG. 20 is a perspective view of an example of an appearance of an illumination apparatus to which any of the light-emitting devices illustrated in FIG. 1 and other figures is applied.

FIG. 20 illustrates an appearance of an illumination apparatus for room lighting to which any of the light-emitting devices 1, 1A, and 5 is applied. The illumination apparatus may include, for example, the illumination units 410 each including the organic EL elements such as the red organic EL element 10R, the green organic EL element 10G, and the blue organic EL element 10B. Appropriate numbers of the illumination units 410 may be disposed at appropriate intervals on a ceiling 420 of a building. It is to be noted that application of the illuminating unit 410 is not only limited to the ceiling 420; the illuminating unit 410 may also be installed on any place such as a wall 430 and an unillustrated floor depending on use application In these illumination apparatuses, illumination may be performed by light emitted from any of the light-emitting devices 1, 1A, and 5 each having the high viewing angle characteristic. Hence, it becomes possible to achieve illumination with superior color rendering properties.

Although description has been given hereinabove with reference to the example embodiments and the application examples, the disclosure is not limited thereto, but may be modified in a wide variety of ways. For example, the numerical values, the structures, the shapes, the materials, and the fabrication methods as described, for example, in the foregoing example embodiments are given as examples. Different numerical values, structures, shapes, materials, or fabrication methods may be adopted.

Moreover, in the foregoing second example embodiment, description has been given of the case where the green organic EL element 50G may have the resonator structure similar to that of the blue organic EL element 50B. However, the green organic EL element 50G may have a resonator structure similar to that of the red organic EL element 50R.

It is to be noted that effects described in the specification are merely exemplified and not limited thereto, and may further include other effects.

Moreover, the disclosure may also have the following configurations.

(1)

A light-emitting device including:
a first reflective surface;
a second reflective surface that faces the first reflective surface;
a light-emitting layer that is provided between the first reflective surface and the second reflective surface, and outputs light of a wavelength $\lambda$; and
a third reflective surface that faces the second reflective surface, and is located at a distance within $\lambda/4$ from the second reflective surface.

(2)

The light-emitting device according to (1), further including a low refractive index layer and a high refractive index layer that have different refractive indexes and are stacked each other,
in which the third reflective surface is an interface between the low refractive index layer and the high refractive index layer.

(3)

The light-emitting device according to (1) or (2), in which the light-emitting layer includes
a first light-emitting layer, and
a second light-emitting layer provided in a region different from the first light-emitting layer, and
L11, L21, L12, and L22 satisfy following expressions [1] to [8]:

$$2L11/\lambda11 + a1/(2\pi) = m1 \text{(provided that } m1 \geq 0\text{)} \quad [1]$$

$$\lambda1 - 150 < \lambda11 < \lambda1 + 80 \quad [2]$$

$$2L21/\lambda21 + c1/(2\pi) = n1 \text{(provided that } n1 \geq 0\text{)} \quad [3]$$

$$\lambda2 - 150 < \lambda21 < \lambda2 + 80 \quad [4]$$

$$2L12/\lambda12 + a2/(2\eta) = m2 \quad [5]$$

$$\lambda1 - 80 < \lambda12 < \lambda1 + 80 \quad [6]$$

$$2L22/\lambda22 + c2/(2\pi) = n2 \quad [7]$$

$$\lambda2 - 80 < \lambda22 < \lambda2 + 80 \quad [8]$$

where

L11 denotes an optical distance from the first reflective surface to a light emission center of the first light-emitting layer, L21 denotes an optical distance from the first reflective surface to a light emission center of the second light-emitting layer, L12 denotes an optical distance from the second reflective surface to the light emission center of the first light-emitting layer, L22 denotes an optical distance from the second reflective surface to the light emission center of the second light-emitting layer, λ1 denotes a center wavelength of a light emission spectrum of the first light-emitting layer, λ2 denotes a center wavelength of a light emission spectrum of the second light-emitting layer, m1, n1, m2, and n2 each denote an integer, λ1, λ2, λ11, λ21, λ12, and λ22 are each in unit of nm, a1 denotes a phase change generated upon reflection, at the first reflective surface, of light of each wavelength outputted from the first light-emitting layer, c1 denotes a phase change generated upon reflection, at the first reflective surface, of light of each wavelength outputted from the second light-emitting layer, a2 denotes a phase change generated upon reflection, at the second reflective surface, of the light of each wavelength outputted from the first light-emitting layer, and c2 denotes a phase change generated upon reflection, at the second reflective surface, of the light of each wavelength outputted from the second light-emitting layer.

(4)

The light-emitting device according to (3), in which L13 and L23 satisfy following expressions [9] to [12]:

$$2L13/\lambda13 + a3/(2\pi) = m3 + \tfrac{1}{2} \quad [9]$$

$$\lambda1 - 150 < \lambda13 < \lambda1 + 150 \quad [10]$$

$$2L23/\lambda23 + c3/(2\pi) = n3 + \tfrac{1}{2} \quad [11]$$

$$\lambda2 - 150 < \lambda23 < \lambda2 + 150 \quad [12]$$

where

L13 denotes an optical distance from the third reflective surface to the light emission center of the first light-emitting layer, L23 denotes an optical distance from the third reflective surface to the light emission center of the second light-emitting layer, m3 and n3 each denote an integer, λ1, λ2, λ13, and λ23 are each in unit of nm, a3 denotes a phase change generated upon reflection, at the third reflective surface, of the light of each wavelength outputted from the first light-emitting layer, and c3 denotes a phase change generated upon reflection, at the third reflective surface, of the light of each wavelength outputted from the second light-emitting layer.

(5)

The light-emitting device according to (3), in which L13 and L23 satisfy following expressions [13] to [16]:

$$2L13/\lambda13 + a3/(2\pi) = m3 \quad [13]$$

$$\lambda1 - 150 < \lambda13 < \lambda1 + 150 \quad [14]$$

$$2L23/\lambda23 + c3/(2\pi) = n3 \quad [15]$$

$$\lambda2 - 150 < \lambda23 < \lambda2 + 150 \quad [16]$$

where

L13 denotes an optical distance from the third reflective surface to the light emission center of the first light-emitting layer, L23 denotes an optical distance from the third reflective surface to the light emission center of the second light-emitting layer, m3 and n3 each denote an integer, λ1, λ2, λ13, and λ23 are each in unit of nm, a3 denotes a phase change generated upon reflection, at the third reflective surface, of the light of each wavelength outputted from the first light-emitting layer, and c3 denotes a phase change generated upon reflection, at the third reflective surface, of the light of each wavelength outputted from the second light-emitting layer.

(6)

The light-emitting device according to any one of (1) to (5), further including:

a first electrode provided between the first reflective surface and the light-emitting layer; and a second electrode that faces the first electrode with the light-emitting layer being interposed therebetween.

(7)

The light-emitting device according to (6), further including a substrate, in which the first electrode, the light-emitting layer, and the second electrode are provided in order from the substrate.

(8)

The light-emitting device according to (6), further including a substrate, in which the second electrode, the light-emitting layer, and the first electrode are provided in order from the substrate.

(9)

The light-emitting device according to any one of (1) to (8), further including an organic layer including the light-emitting layer.

(10)

The light-emitting device according to (9), in which the light-emitting layer is a printed layer.

(11)

The light-emitting device according to (9) or (10), further including a high resistance layer that is provided between the organic layer and the second reflective surface, and contains a metal oxide, in which the third reflective surface is an interface between the organic layer and the high resistance layer.

(12)

The light-emitting device according to any one of (3) to (5), further including:

a fourth reflective surface that faces the light-emitting layer with the second reflective surface being interposed therebetween; and a fifth reflective surface that faces the second reflective surface with the fourth reflective surface being interposed therebetween.

(13)

The light-emitting device according to (12), in which L14 and L15 satisfy following expressions [17] to [20]:

$$2L14/\lambda14 + a4/(2\pi) = m4 + \tfrac{1}{2} \quad [17]$$

$$2L15/\lambda15 + a5/(2\pi) = m5 + \tfrac{1}{2} \quad [18]$$

$$\lambda1 - 150 < \lambda14 < \lambda1 + 150 \quad [19]$$

$$\lambda1 - 150 < \lambda15 < \lambda1 + 150 \quad [20]$$

where

L14 denotes an optical distance from the fourth reflective surface to the light emission center of the first light-emitting layer, L15 denotes an optical distance from the fifth reflective surface to the light emission center of the first light-emitting layer, m4 and m5 each denote an integer, $\lambda 1$, $\lambda 14$, and $\lambda 15$ are each in unit of nm, a4 denotes a phase change generated upon reflection, at the fourth reflective surface, of the light of each wavelength outputted from the first light-emitting layer, and a5 denotes a phase change generated upon reflection, at the fifth reflective surface, of the light of each wavelength outputted from the first light-emitting layer.

(14)

The light-emitting device according to (12) or (13), in which

L24 and L25 satisfy following expressions [21] to [24]:

$$2L24/\lambda 24 + c4/(2\pi) = n4 \quad [21]$$

$$2L25/\lambda 25 + c5/(2\pi) = n5 \quad [22]$$

$$\lambda 2 - 150 < \lambda 24 < \lambda 2 + 150 \quad [23]$$

$$\lambda 2 - 150 < \lambda 25 < \lambda 2 + 150 \quad [24]$$

where

L24 denotes an optical distance from the fourth reflective surface to the light emission center of the second light-emitting layer, L25 denotes an optical distance from the fifth reflective surface to the light emission center of the second light-emitting layer, n4 and n5 each denote an integer, $\lambda 2$, $\lambda 24$, and $\lambda 25$ are each in unit of nm, c4 denotes a phase change generated upon reflection, at the fourth reflective surface, of the light of each wavelength outputted from the second light-emitting layer, and c5 denotes a phase change generated upon reflection, at the fifth reflective surface, of the light of each wavelength outputted from the second light-emitting layer.

(15)

The light-emitting device according to any one of (12) to (14), further including a sixth reflective surface that is provided at one or more of: a location between the second reflective surface and the fourth reflective surface; a location between the fourth reflective surface and the fifth reflective surface; and a location that faces the fourth reflective surface with the fifth reflective surface being interposed therebetween.

In the light-emitting device according to one embodiment of the disclosure, the third reflective surface is located at a distance within $\lambda/4$ from the second reflective surface; in other words, the third reflective surface is provided near the second reflective surface. Hence, reflection of light at the third reflective surface exhibits similar tendency over a wide range of a wavelength $\lambda$. For example, red light, green light, and blue light reflect at the third reflective surface to cause uniform weakening or strengthening.

According to the light-emitting device of one embodiment of the disclosure, the third reflective surface is provided near the second reflective surface, thus allowing for uniform control of the reflection of light at the third reflective surface over a wide range of a wavelength $\lambda$. Hence, it becomes possible to control the resonance state of the light of a wide range of the wavelength $\lambda$. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A light-emitting device comprising:
   a first reflective surface;
   a second reflective surface that faces the first reflective surface;
   a light-emitting layer that is provided between the first reflective surface and the second reflective surface, and outputs light of a wavelength $\lambda$; and
   a third reflective surface that faces the second reflective surface, and is located at a distance within $\lambda/4$ from the second reflective surface.

2. The light-emitting device according to claim 1, further comprising a low refractive index layer and a high refractive index layer that have different refractive indexes and are stacked each other, wherein
   the third reflective surface is an interface between the low refractive index layer and the high refractive index layer.

3. The light-emitting device according to claim 1, wherein the light-emitting layer includes
   a first light-emitting layer, and
   a second light-emitting layer provided in a region different from the first light-emitting layer, and
   L11, L21, L12, and L22 satisfy following expressions [1] to [8]:

$$2L11/\lambda 11 + a1/(2\pi) = m1 \text{(provided that } m1 \geq 0) \quad [1]$$

$$\lambda 1 - 150 < \lambda 11 < \lambda 1 + 80 \quad [2]$$

$$2L21/\lambda 21 + c1/(2\pi) = n1 \text{(provided that } n1 \geq 0) \quad [3]$$

$$\lambda 2 - 150 < \lambda 21 < \lambda 2 + 80 \quad [4]$$

$$2L12/\lambda 12 + a2/(2\pi) = m2 \quad [5]$$

$$\lambda 1 - 80 < \lambda 12 < \lambda 1 + 80 \quad [6]$$

$$2L22/\lambda 22 + c2/(2\pi) = n2 \quad [7]$$

$$\lambda 2 - 80 < \lambda 22 < \lambda 2 + 80 \quad [8]$$

where
L11 denotes an optical distance from the first reflective surface to a light emission center of the first light-emitting layer,
L21 denotes an optical distance from the first reflective surface to a light emission center of the second light-emitting layer,
L12 denotes an optical distance from the second reflective surface to the light emission center of the first light-emitting layer,
L22 denotes an optical distance from the second reflective surface to the light emission center of the second light-emitting layer,
λ1 denotes a center wavelength of a light emission spectrum of the first light-emitting layer,
λ2 denotes a center wavelength of a light emission spectrum of the second light-emitting layer,
m1, n1, m2, and n2 each denote an integer,
λ1, λ2, λ11, λ21, λ12, and λ22 are each in unit of nm,
a1 denotes a phase change generated upon reflection, at the first reflective surface, of light of each wavelength outputted from the first light-emitting layer,
c1 denotes a phase change generated upon reflection, at the first reflective surface, of light of each wavelength outputted from the second light-emitting layer,
a2 denotes a phase change generated upon reflection, at the second reflective surface, of the light of each wavelength outputted from the first light-emitting layer, and
c2 denotes a phase change generated upon reflection, at the second reflective surface, of the light of each wavelength outputted from the second light-emitting layer.

4. The light-emitting device according to claim 3, wherein L13 and L23 satisfy following expressions [9] to [12]:

$$2L13/\lambda13+a3/(2\pi)=m3+\tfrac{1}{2} \quad [9]$$

$$\lambda1-150<\lambda13<\lambda1+150 \quad [10]$$

$$2L23/\lambda23+c3/(2\pi)=n3+\tfrac{1}{2} \quad [11]$$

$$\lambda2-150<\lambda23<\lambda2+150 \quad [12]$$

where
L13 denotes an optical distance from the third reflective surface to the light emission center of the first light-emitting layer,
L23 denotes an optical distance from the third reflective surface to the light emission center of the second light-emitting layer,
m3 and n3 each denote an integer,
λ1, λ2, λ13, and λ23 are each in unit of nm,
a3 denotes a phase change generated upon reflection, at the third reflective surface, of the light of each wavelength outputted from the first light-emitting layer, and
c3 denotes a phase change generated upon reflection, at the third reflective surface, of the light of each wavelength outputted from the second light-emitting layer.

5. The light-emitting device according to claim 3, wherein L13 and L23 satisfy following expressions [13] to [16]:

$$2L13/\lambda13+a3/(2\pi)=m3 \quad [13]$$

$$\lambda1-150<\lambda13<\lambda1+150 \quad [14]$$

$$2L23/\lambda23+c3/(2\pi)=n3 \quad [15]$$

$$\lambda2-150<\lambda23<\lambda2+150 \quad [16]$$

where
L13 denotes an optical distance from the third reflective surface to the light emission center of the first light-emitting layer,
L23 denotes an optical distance from the third reflective surface to the light emission center of the second light-emitting layer,
m3 and n3 each denote an integer,
λ1, λ2, λ13, and λ23 are each in unit of nm,
a3 denotes a phase change generated upon reflection, at the third reflective surface, of the light of each wavelength outputted from the first light-emitting layer, and
c3 denotes a phase change generated upon reflection, at the third reflective surface, of the light of each wavelength outputted from the second light-emitting layer.

6. The light-emitting device according to claim 1, further comprising:
a first electrode provided between the first reflective surface and the light-emitting layer; and
a second electrode that faces the first electrode with the light-emitting layer being interposed therebetween.

7. The light-emitting device according to claim 6, further comprising a substrate, wherein
the first electrode, the light-emitting layer, and the second electrode are provided in order from the substrate.

8. The light-emitting device according to claim 6, further comprising a substrate, wherein
the second electrode, the light-emitting layer, and the first electrode are provided in order from the substrate.

9. The light-emitting device according to claim 1, further comprising an organic layer including the light-emitting layer.

10. The light-emitting device according to claim 9, wherein the light-emitting layer comprises a printed layer.

11. The light-emitting device according to claim 9, further comprising a high resistance layer that is provided between the organic layer and the second reflective surface, and contains a metal oxide, wherein
the third reflective surface is an interface between the organic layer and the high resistance layer.

12. The light-emitting device according to claim 3, further comprising:
a fourth reflective surface that faces the light-emitting layer with the second reflective surface being interposed therebetween; and
a fifth reflective surface that faces the second reflective surface with the fourth reflective surface being interposed therebetween.

13. The light-emitting device according to claim 12, wherein
L14 and L15 satisfy following expressions [17] to [20]:

$$2L14/\lambda14+a4/(2\pi)=m4+\tfrac{1}{2} \quad [17]$$

$$2L15/\lambda15+a5/(2\pi)=m5+\tfrac{1}{2} \quad [18]$$

$$\lambda1-150<\lambda14<\lambda1+150 \quad [19]$$

$$\lambda1-150<\lambda15<\lambda1+150 \quad [20]$$

where
L14 denotes an optical distance from the fourth reflective surface to the light emission center of the first light-emitting layer,
L15 denotes an optical distance from the fifth reflective surface to the light emission center of the first light-emitting layer,
m4 and m5 each denote an integer,
λ1, λ14, and λ15 are each in unit of nm, a4 denotes a phase change generated upon reflection, at the fourth reflective surface, of the light of each wavelength outputted from the first light-emitting layer, and a5 denotes a phase change generated upon reflection, at the fifth reflective surface, of the light of each wavelength outputted from the first light-emitting layer.

14. The light-emitting device according to claim 12, wherein

L24 and L25 satisfy following expressions [21] to [24]:

$$2L24/\lambda24 + c4/(2\pi) = n4 \quad [21]$$

$$2L25/\lambda25 + c5/(2\pi) = n5 \quad [22]$$

$$\lambda2 - 150 < \lambda24 < \lambda2 + 150 \quad [23]$$

$$\lambda2 - 150 < \lambda25 < \lambda2 + 150 \quad [24]$$

where

L24 denotes an optical distance from the fourth reflective surface to the light emission center of the second light-emitting layer, L25 denotes an optical distance from the fifth reflective surface to the light emission center of the second light-emitting layer, n4 and n5 each denote an integer, $\lambda2$, $\lambda24$, and $\lambda25$ are each in unit of nm, c4 denotes a phase change generated upon reflection, at the fourth reflective surface, of the light of each wavelength outputted from the second light-emitting layer, and c5 denotes a phase change generated upon reflection, at the fifth reflective surface, of the light of each wavelength outputted from the second light-emitting layer.

15. The light-emitting device according to claim 12, further comprising a sixth reflective surface that is provided at one or more of: a location between the second reflective surface and the fourth reflective surface; a location between the fourth reflective surface and the fifth reflective surface; and a location that faces the fourth reflective surface with the fifth reflective surface being interposed therebetween.

16. The light-emitting device according to claim 1, further comprising:

a first electrode defining the first reflective surface;

a second electrode facing the first electrode with the light-emitting layer interposed therebetween; and a light emission surface between the first electrode and the second reflective surface, and configured to emit a light.

17. The light-emitting device according to claim 16, wherein the first reflective surface is distanced from the light emission surface to strengthen the light of a center wavelength of a light emission spectrum of the light emission surface, and the second reflective surface is distanced from the light-emitting layer to strengthen the light of the center wavelength of the light emission spectrum of the light emission surface.

18. The light-emitting device according to claim 16, wherein the second electrode is between the first reflective surface and the second reflective surface.

19. The light-emitting device according to claim 16, wherein the light emission surface is configured to emit a monochromatic light.

* * * * *